US011967555B2

(12) United States Patent
Lee

(10) Patent No.: US 11,967,555 B2
(45) Date of Patent: Apr. 23, 2024

(54) SEMICONDUCTOR DEVICE AND MANUFACTURING METHOD OF SEMICONDUCTOR DEVICE

(71) Applicant: SK hynix Inc., Icheon-si (KR)

(72) Inventor: Nam Jae Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 18/103,228

(22) Filed: Jan. 30, 2023

(65) Prior Publication Data

US 2023/0178485 A1 Jun. 8, 2023

Related U.S. Application Data

(63) Continuation of application No. 17/158,860, filed on Jan. 26, 2021, now Pat. No. 11,594,486.

(30) Foreign Application Priority Data

Jul. 27, 2020 (KR) ........................ 10-2020-0093249

(51) Int. Cl.
H01L 23/528 (2006.01)
H10B 43/27 (2023.01)
(52) U.S. Cl.
CPC ........... *H01L 23/528* (2013.01); *H10B 43/27* (2023.02)
(58) Field of Classification Search
CPC ....... H01L 23/528; H10B 43/27; H10B 43/35; H10B 43/30; H10B 43/20; H10B 43/50
See application file for complete search history.

(56) References Cited

U.S. PATENT DOCUMENTS

| 9,711,524 B2* | 7/2017 | Shoji ...................... H10B 43/10 |
| 2010/0237400 A1 | 9/2010 | Aoyama | |
| 2011/0013454 A1 | 1/2011 | Hishida et al. | |
| 2013/0334589 A1* | 12/2013 | Ahn ...................... H01L 29/7926 |
| | | | 257/324 |
| 2015/0279857 A1 | 10/2015 | Kim et al. | |
| 2021/0159169 A1* | 5/2021 | Zhao ...................... H10B 43/10 |
| 2022/0109002 A1* | 4/2022 | Gupta .................... H10B 43/10 |

FOREIGN PATENT DOCUMENTS

| KR | 1020100133212 A | 12/2010 |
| KR | 1020150062768 A | 6/2015 |
| KR | 101818675 B1 | 1/2018 |

* cited by examiner

*Primary Examiner* — Galina G Yushina
(74) *Attorney, Agent, or Firm* — WILLIAM PARK & ASSOCIATES LTD.

(57) ABSTRACT

A semiconductor device includes: a stack structure including conductive patterns and stack insulating layers, which are alternately stacked; a channel structure penetrating the stack structure; a tunnel insulating layer surrounding the channel structure; a cell storage pattern surrounding the tunnel insulating layer; and a dummy storage pattern surrounding the tunnel insulating layer, the dummy storage pattern being spaced apart from the cell storage pattern. The conductive patterns include a select conductive pattern in contact with the tunnel insulating layer.

12 Claims, 20 Drawing Sheets

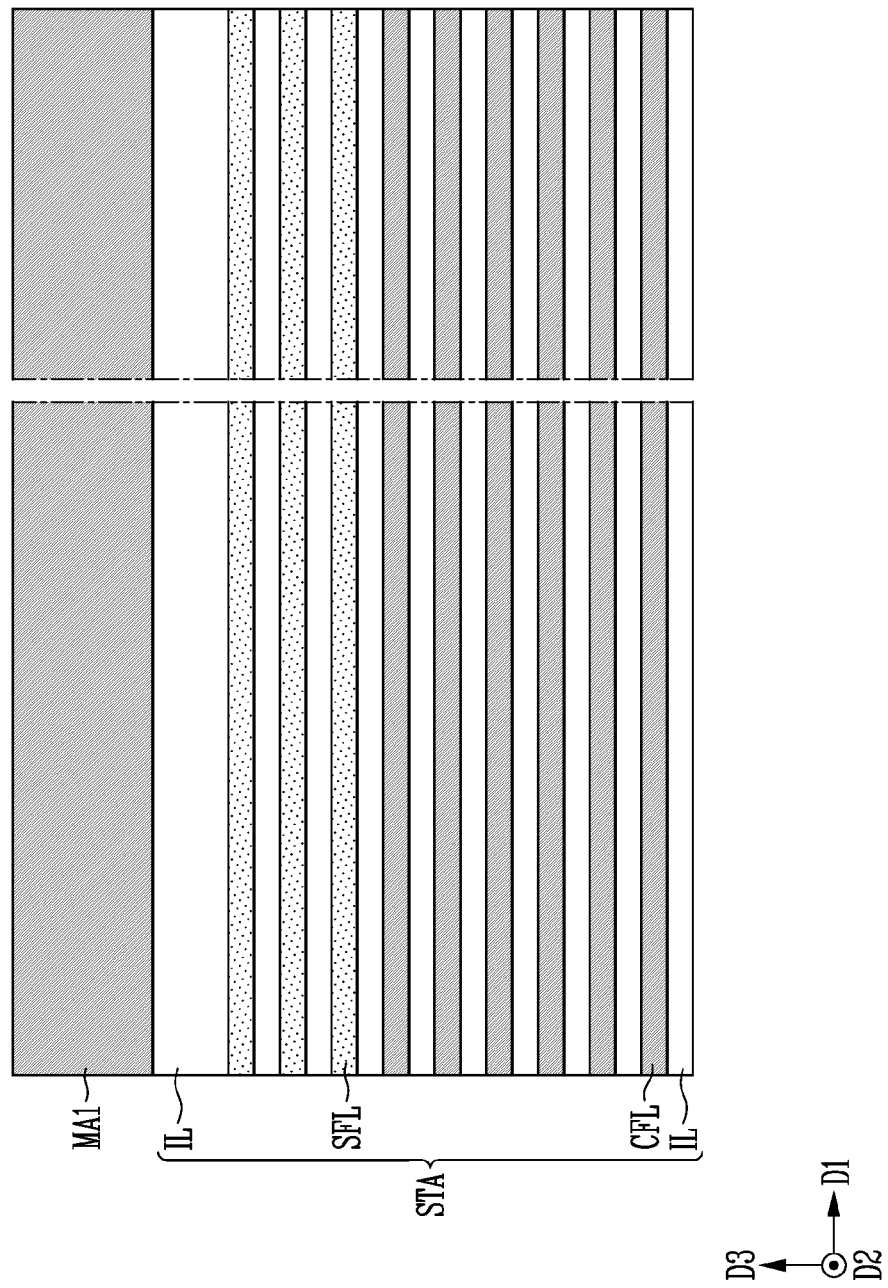

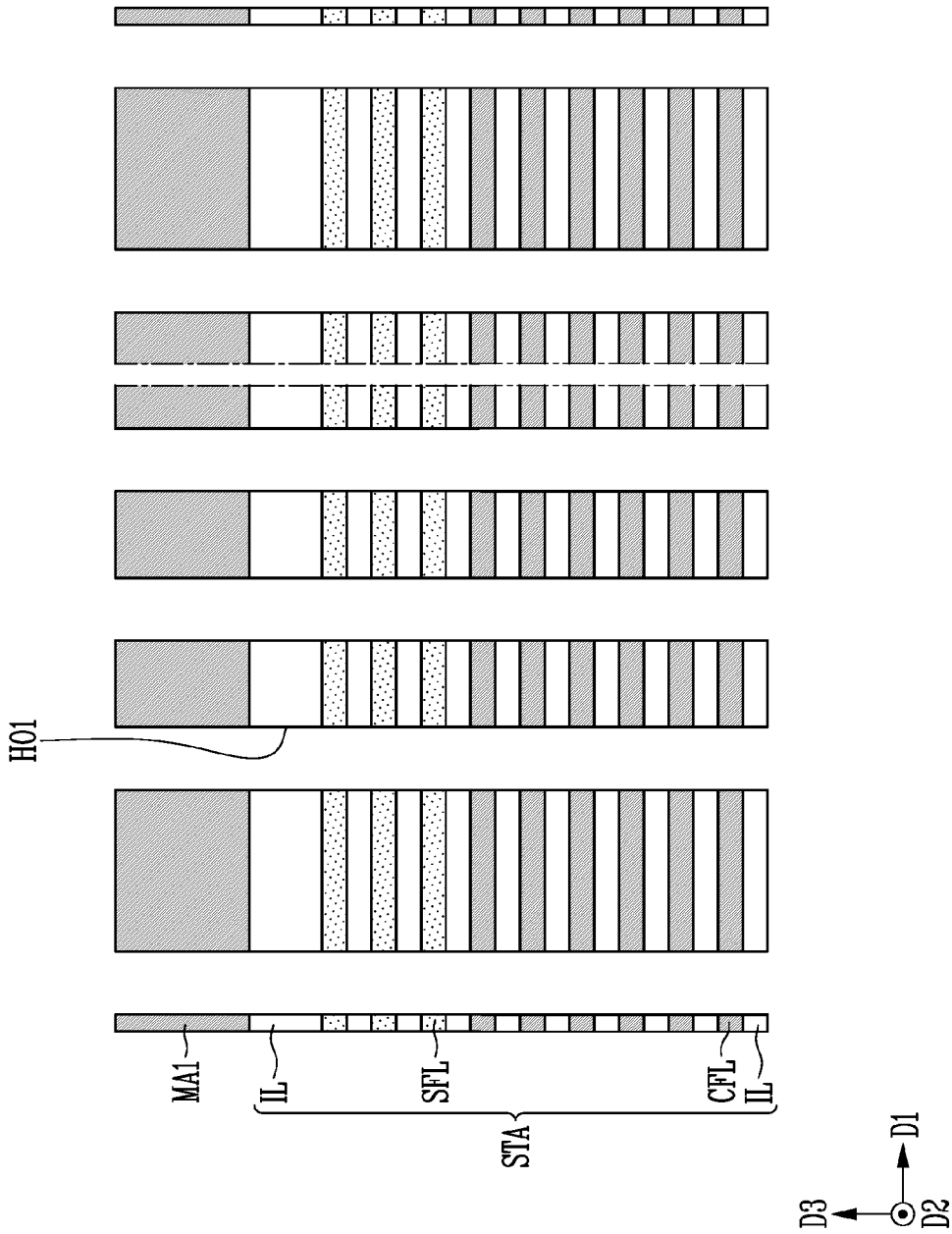

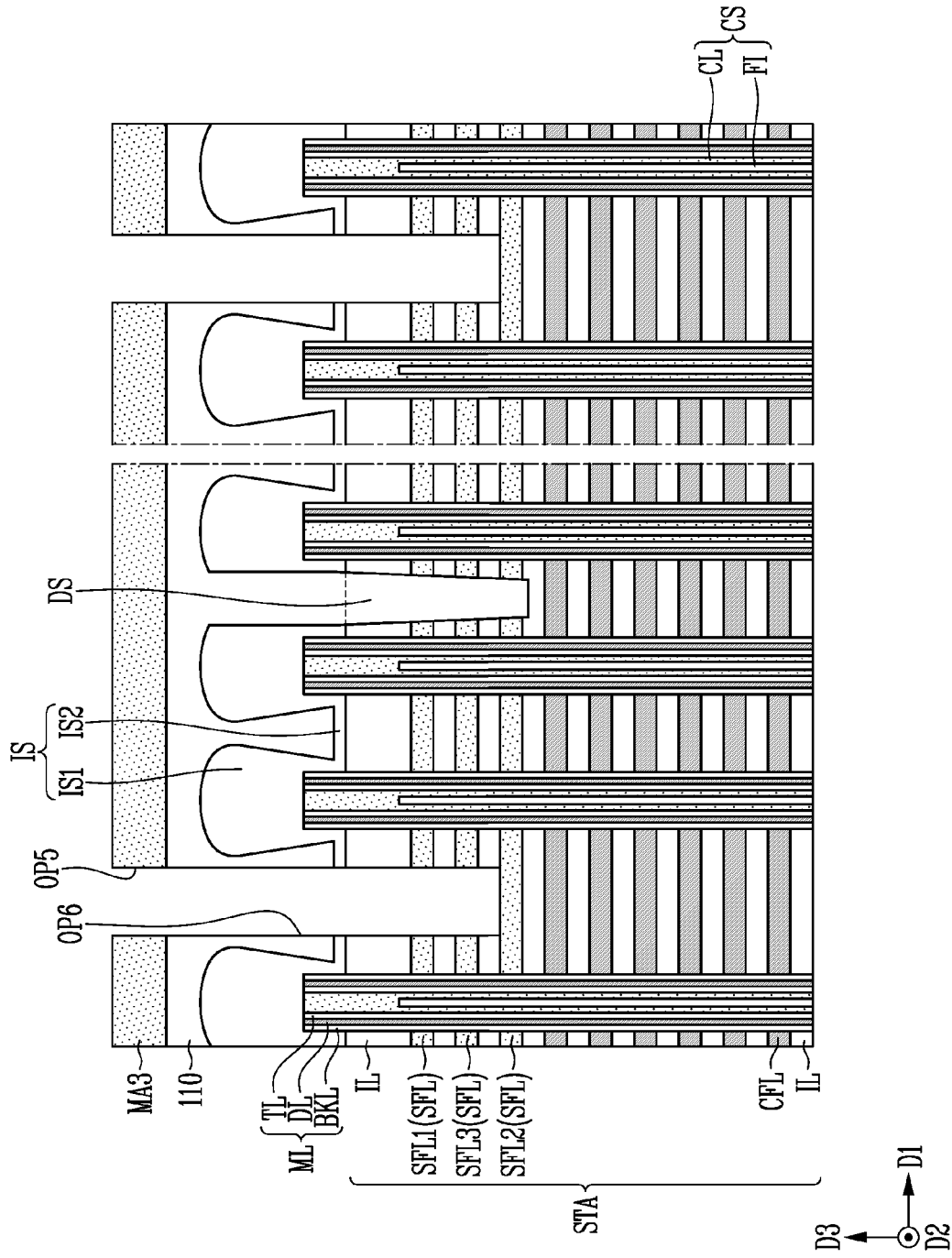

SEMICONDUCTOR DEVICE AND MANUFACTURING METHOD OF SEMICONDUCTOR DEVICE

CROSS-REFERENCE TO RELATED APPLICATION

The present application is a continuation application of U.S. patent application Ser. No. 17/158,860, filed on Jan. 26, 2021, and claims priority under 35 U.S.C. § 119(a) to Korean patent application number 10-2020-0093249, filed on Jul. 27, 2020, in the Korean Intellectual Property Office, the entire disclosure of which is incorporated herein by reference.

BACKGROUND

1. Technical Field

The present disclosure generally relates to a semiconductor device and a manufacturing method of a semiconductor device, and more particularly, to a three-dimensional semiconductor device and a manufacturing method of a three-dimensional semiconductor device.

2. Related Art

A semiconductor device includes memory cells capable of storing data. A three-dimensional semiconductor device includes three-dimensionally arranged memory cells, so that an area occupied by memory cells per unit area of a substrate can be reduced.

In order to improve the degree of integration of the three-dimensional semiconductor device, a stacked number of memory cells may increase. The operational reliability of the three-dimensional semiconductor device may be deteriorated as the stacked number of memory cells increases.

SUMMARY

In accordance with an aspect of the present disclosure, there may be provided a semiconductor device including: a stack structure including conductive patterns and stack insulating layers, which are alternately stacked; a channel structure penetrating the stack structure; a tunnel insulating layer surrounding the channel structure; a cell storage pattern surrounding the tunnel insulating layer; and a dummy storage pattern surrounding the tunnel insulating layer, the dummy storage pattern being spaced apart from the cell storage pattern, wherein the conductive patterns include a select conductive pattern in contact with the tunnel insulating layer.

In accordance with another aspect of the present disclosure, there may be provided a semiconductor device including: a stack structure including stack insulating layers and conductive patterns, which are alternately stacked; cell plugs penetrating the stack structure; and an isolation structure between the cell plugs, wherein the conductive patterns includes a select conductive pattern in contact with the isolation structure, wherein a recess is defined when a sidewall of the isolation structure is depressed, and wherein the select conductive pattern includes an insertion part inserted into the recess.

In accordance with still another aspect of the present disclosure, there may be provided a semiconductor device including: a stack structure including stack insulating layers and conductive patterns, which are alternately stacked; a cell plug penetrating the stack structure; and an insulating structure covering the stack structure and the cell plug, wherein the cell plug includes a protrusion part protruding to the outside of the stack structure, wherein the insulating structure includes a first part covering the protrusion part and a second part covering a top surface of the stack structure, and wherein a width of the first part is largest at a first level between a central portion of the first part and an uppermost portion of the first part.

In accordance with still another aspect of the present disclosure, there may be provided a method of manufacturing a semiconductor device, the method including: forming a stack structure including a cell sacrificial layer, a select sacrificial layer, and a stack insulating layer, which overlap with each other; forming a first opening exposing the select sacrificial layer; removing the select sacrificial layer through the first opening; forming a first part of a filling sacrificial layer in an empty space formed by removing the select sacrificial layer; forming a do second opening exposing the first part of the filling sacrificial layer and the cell sacrificial layer; and removing the first part of the filling sacrificial layer and the cell sacrificial layer.

In accordance with still another aspect of the present disclosure, there may be provided a method of manufacturing a semiconductor device, the method including: forming a stack structure including a cell sacrificial layer, a select sacrificial layer, and a stack insulating layer, which overlap with each other; forming cell plugs penetrating the stack structure, the cell plugs protruding to the outside of the stack structure; forming an insulating structure including first parts covering the cell plugs and a second part covering a top surface of the stack structure; forming a mask layer including a first opening exposing a cavity between the first parts; and etching the stack structure through the first opening and the cavity.

BRIEF DESCRIPTION OF THE DRAWINGS

Examples of embodiments will now be described hereinafter with reference to the accompanying drawings; however, they may be embodied in different forms and should not be construed as limited to the embodiments set forth herein. Rather, these embodiments are provided so that this disclosure will be thorough and complete, and will convey the scopes of the examples of embodiments to those skilled in the art.

In the drawing figures, dimensions may be exaggerated for clarity of illustration. It will be understood that when an element is referred to as being "between" two elements, it can be the only element between the two elements, or one or more intervening elements may also be present, Like reference numerals refer to like elements throughout.

FIGS. 2, 3, 4, 5, 6, 7, 8, 9, 10, 11A, 12A, 13, and 14 are sectional views illustrating a manufacturing method of the semiconductor device shown in FIGS. 1A to 1C.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Embodiments provide a semiconductor device and a manufacturing method of a semiconductor device, which may improve operational reliability.

Figure 1A:
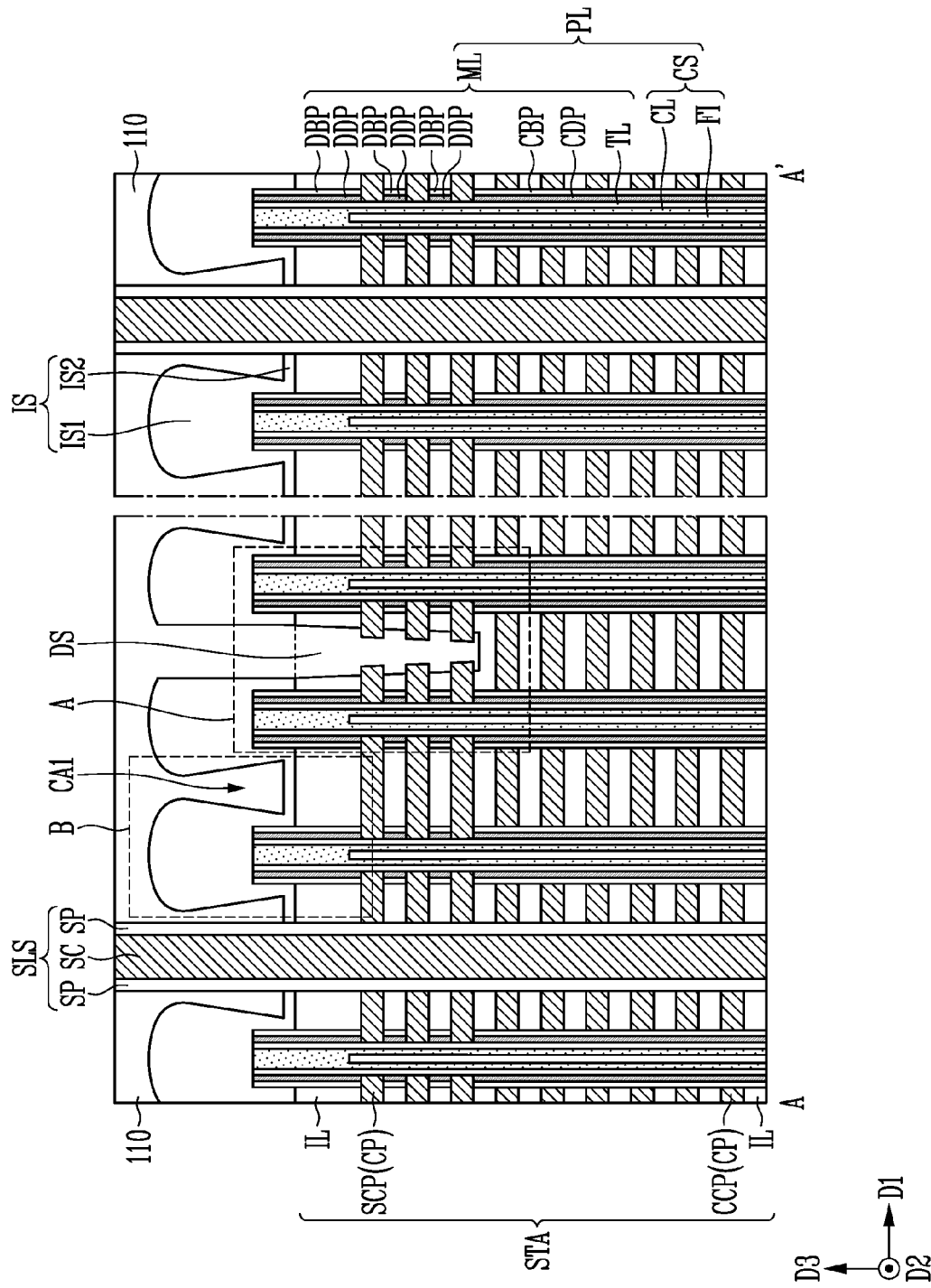
FIG. 1A is a sectional view of a semiconductor device in accordance with an embodiment of the present disclosure.
Figure 1B:
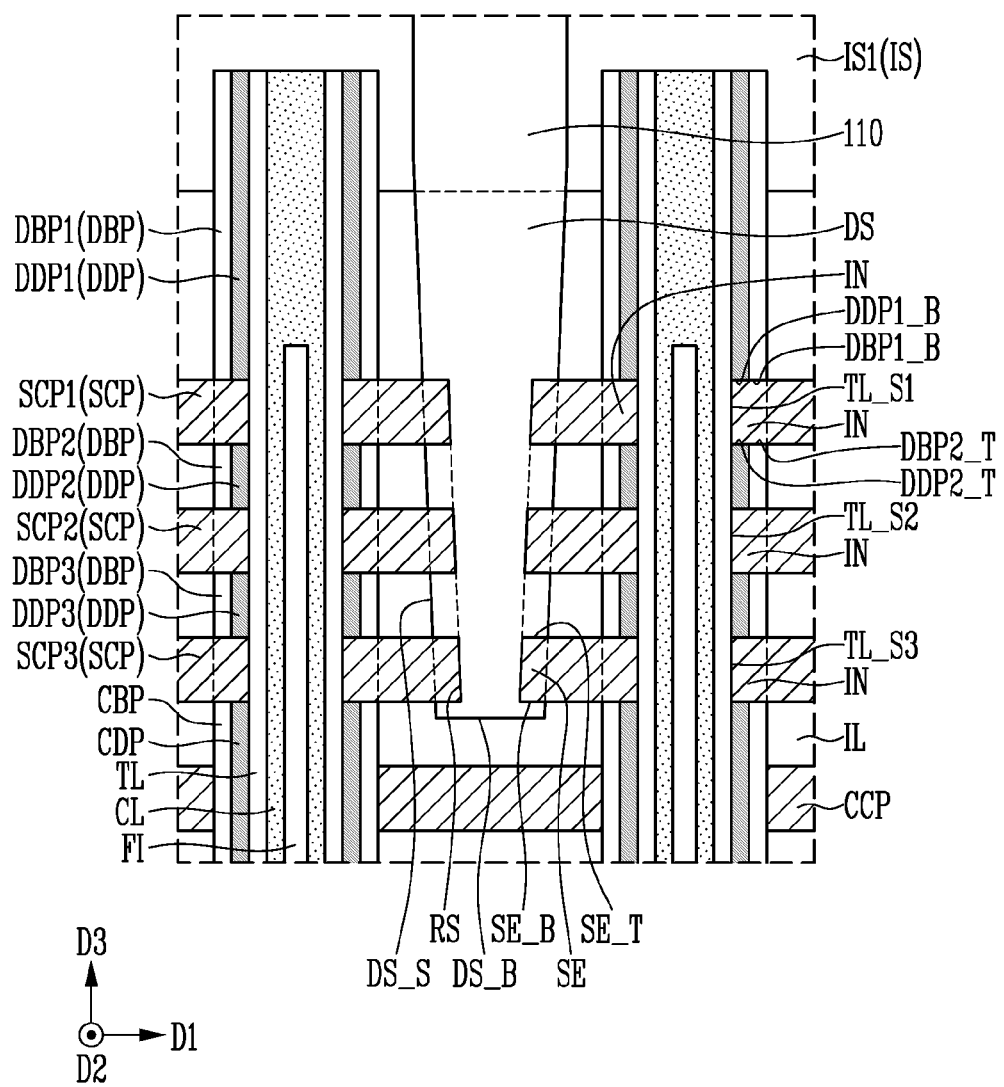
FIG. 1B is an enlarged view of region A shown in FIG. 1A.
Figure 1C:
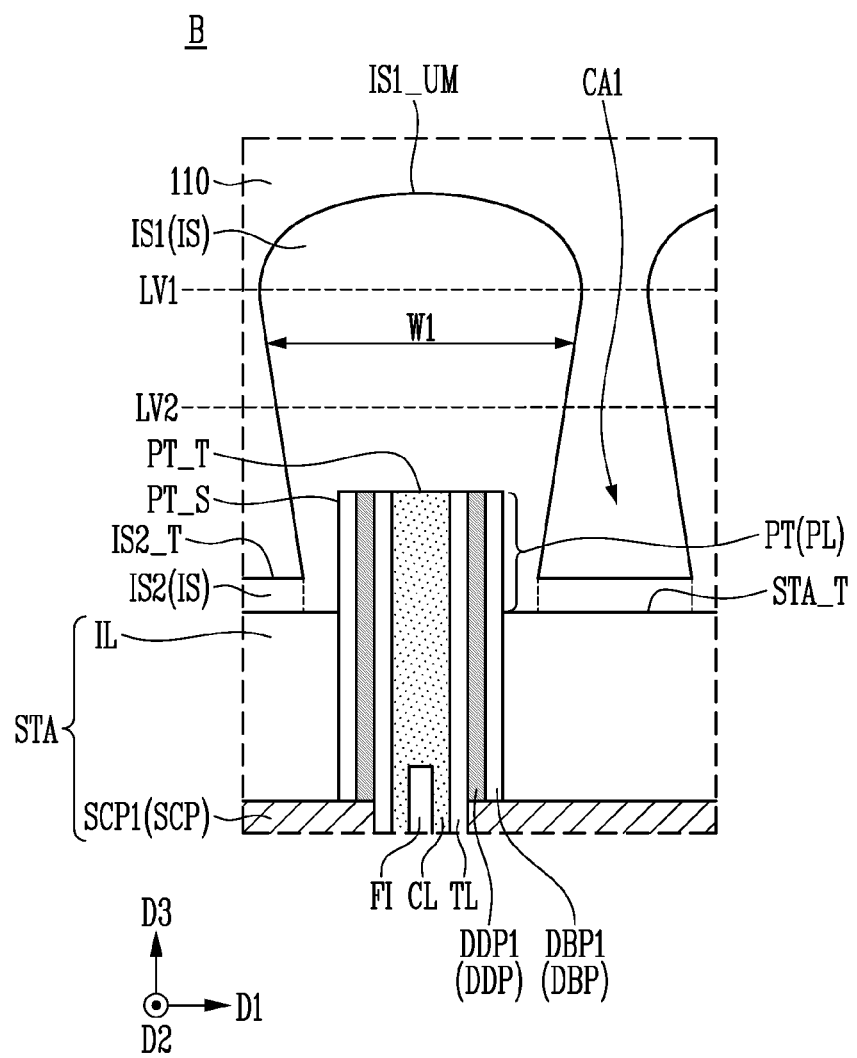
FIG. 1C is an enlarged view of region B shown in FIG. 1A.

FIG. 1A is a sectional view of a semiconductor device in accordance with an embodiment of the present disclosure. FIG. 1B is an enlarged view of region A shown in FIG. 1A. FIG. 1C is an enlarged view of region B shown in FIG. 1A.

Referring to FIG. 1A, the semiconductor device may include a stack structure STA. In an embodiment, the stack structure STA may be provided on a source structure (not shown). The source structure may have the shape of a plate expanding along a plane defined by a first direction D1 and a second direction D2. The first direction D1 and the second direction D2 may intersect each other. In an example, the first direction D1 and the second direction D2 may be orthogonal to each other. The source structure may be used as a source line of the semiconductor device. The source structure may include a conductive material. In an example, the source structure may include poly-silicon.

In an embodiment, the source structure may be provided on a substrate physically supporting the source structure. The substrate may have the shape of a plate expanding along a plane defined by the first direction D1 and the second direction D2. In an example, the substrate may be a semiconductor substrate.

In an embodiment, a peripheral circuit structure (not shown) including transistors and lines may be provided between the source structure and the substrate.

The stack structure STA may include conductive patterns CP and stack insulating layers IL, which are alternately stacked in a third direction D3, The third direction D3 may intersect the first direction D1 and the second direction D2. In an example, the third direction D3 may be orthogonal to the first direction D1 and the second direction D2.

The stack insulating layers IL may include an insulating material. Each of the conductive patterns CP may include a conductive layer. In an example, the conductive layer may include at least one of a doped silicon layer, a metal silicide layer, tungsten, nickel, and cobalt. In an embodiment, each of the conductive patterns CP may further include a barrier layer covering a surface of the conductive layer. The barrier layer may be formed between the conductive layer and the stack insulating layer IL. In an example, the barrier layer may include titanium, titanium nitride, tantalum or tantalum nitride.

The conductive patterns CP may include select conductive patterns SCP used as select lines and cell conductive patterns CCP used as word lines. Conductive patterns CP disposed at an upper portion of the stack structure STA may be defined as the conductive patterns SCP, and conductive patterns CP disposed under the select conductive patterns SCP may be defined as the cell conductive patterns CCP.

Cell plugs PL may be provided, which penetrate the stack structure. Each of the cell plugs PL may include a channel structure CS and a memory layer ML.

The channel structure CS may penetrate the stack structure STA. The channel structure may penetrate the stack insulating layers IL and the conductive patterns CP of the stack structure STA. The channel structures CS may extend in the third direction D3.

Each of the channel structures CS may include a filling layer FI and a channel layer CL surrounding the filling layer FI. The filling layer FI and the channel layer CL may extend in the third direction D3. The channel layer CL may cover a top surface of the filling layer FI. An upper portion of the channel structure CS may protrude upwardly of the stack structure STA. An upper portion of the channel layer CL may protrude upwardly of the stack structure STA. The filling layer FI may include an insulating material. In an example, the filling layer may include oxide. The channel layer CL may include a semiconductor material. In an example, the channel layer CL may include poly-silicon. The channel layer CL may be electrically connected to the source structure.

The memory layer ML may surround the channel structure CS. The memory layer ML may penetrate the stack structure STA. The memory layer ML may penetrate the stack insulating layers IL and the conductive patterns CP of the stack structure STA. The memory layer ML may extend in the third direction D3. An upper portion of the memory layer ML may protrude upwardly of the stack structure STA. The memory layer ML may include a tunnel insulating layer TL surrounding the channel layer CL, a cell storage pattern CDP and dummy storage patterns DDP, which surround the tunnel insulating layer TL, a cell blocking pattern CBP surrounding the cell storage pattern CDP, and dummy blocking patterns DBP respectively surrounding the dummy storage patterns DDP.

The cell storage pattern CDP and the dummy storage pattern DDP may be spaced apart from each other in the third direction D3.

The tunnel insulating layer TL may include a material through which charges can tunnel. In an example, the tunnel insulating layer TL may include oxide. In an embodiment, the cell storage pattern CDP and the dummy storage patterns DDP may include a material in which charges can be trapped. In an embodiment, the cell storage pattern CDP and the dummy storage patterns DDP may include nitride. In another embodiment, the cell storage pattern CDP and the dummy storage patterns DDP may include various materials according to a data storage method. In an example, the cell storage pattern CDP and the dummy storage patterns DDP may include silicon, a phase change material, or nano dots. The cell blocking pattern CBP and the dummy blocking patterns DBP may include a material capable of blocking movement of charges. In an embodiment, the cell blocking pattern CBP and the dummy blocking patterns DBP may include oxide.

An isolation structure DS may be provided in the stack structure STA. The isolation structure DS may be provided between the cell plugs PL. The isolation structure DS may be provided in the upper portion of the stack structure STA. The isolation structure DS may extend in the second direction D2 and the third direction D3. The isolation structure DS may isolate the select conductive patterns SCP from each other in the first direction D1. The isolation structure DS may isolate stack insulating layers IL disposed at the upper portion of the stack structure STA from each other in the first direction D1. The isolation structure DS may include an insulating material. In an example, the isolation structure DS may include oxide. The isolation structure DS may be in contact with the select conductive patterns SCP. The isolation structure DS may be spaced apart from the cell conductive patterns CCP.

An insulating structure IS may be provided, which covers the stack structure STA and the cell plugs PL. The insulating structure IS may include an insulating material. In an example, the insulating structure IS may include oxide or an amorphous carbon layer.

The insulating structure IS may include first parts IS1 and a second part IS2. The first part IS1 of the insulating structure IS may be a part covering the cell plug PL. The second part IS2 of the insulating structure IS may be a part covering a top surface of the stack structure STA.

The second part IS2 of the insulating structure IS may connect the first parts IS1 of the insulating structure IS to each other.

The second part IS2 of the insulating structure IS may cover a top surface of an uppermost stack insulating layer IL of the stack structure STA.

A first cavity CA1 may be defined by sidewalls of the first parts IS1 of the insulating structure IS and a top surface of the second part IS2 of the insulating structure IS. The first cavity CA1 may be a space between the first parts IS1 of the insulating structure IS.

A first insulating layer 110 may be provided, which covers the insulating structure IS and the isolation structure DS. The first insulating layer 110 may fill the first cavity CA1. The first insulating layer 110 may cover a top surface of the isolation structure DS. The first insulating layer 110 may include an insulating material. In an example, the first insulating layer 110 may include oxide. The first insulating layer 110 may be continuously formed with the isolation structure DS without any boundary. The first insulating layer 110 may be integrally formed with the isolation structure DS.

Slit structures SLS may be provided, which penetrate the first insulating layer 110, the insulating structure IS, and the stack structure STA. The slit structures SLS may extend in the second direction D2 and the third direction D3. The stack insulating layers IL, the select conductive patterns SCP, and the cell conductive patterns CCP may be isolated from each other in the first direction D1 by the slit structure SLS.

In an embodiment, the slit structure SLS may include spacers SP and a source contact SC. The spacers SP may be disposed at both sides of the source contact SC. The spacers SP and the source contact SC may extend in the second direction D2 and the third direction D3. The spacers SP may be spaced apart from each other in the first direction D1 with the source contact SC interposed therebetween. The source contact SC may be electrically isolated from the conductive pattern CP by the spacer SP. The source contact SC may be electrically connected to the source structure. In another embodiment, the slit structure SLS may include an insulator which substitutes for the source contact CS.

The spacer SP may include an insulating material. In an example, the spacer SP may include oxide. The source contact SC may include a conductive material. In an example, the source contact SC may include at least one of poly-silicon and tungsten.

A bit line contact (not shown) may be provided, which penetrates the first part IS1 of the insulating structure IS and is connected to the channel layer CL. The bit line contact may extend in the third direction D3. The bit line contact may include a conductive material. In an example, the bit line contact may include copper, aluminum or tungsten. The channel layer CL may be electrically connected to a bit line through the bit line contact.

Referring to FIG. 1B, the select conductive patterns SCP may include first select conductive patterns SCP1, second select conductive patterns SCP2 disposed at a level lower than that of the first select conductive patterns SCP1, and third select conductive patterns SCP3 disposed at a level lower than that of the second select conductive patterns SCP2. The second select conductive patterns SCP2 may be disposed between the first and third select conductive patterns SCP1 and SCP3. The cell conductive patterns CCP may be disposed at a level lower than all of the first to third select conductive patterns SCP1, SCP2, and SCP3.

The dummy storage patterns DDP may include first dummy storage patterns DDP1, second dummy storage patterns DDP2 disposed at a level lower than that of the first dummy storage patterns DDP1, and third dummy storage patterns DDP3 disposed at a level lower than that of the second dummy storage patterns DDP2. The second dummy storage patterns DDP2 may be disposed between the first and third dummy storage patterns DDP1 and DDP3. The cell storage pattern CDP may be disposed at a level lower than all of the first to third dummy storage patterns DDP1, DDP2, and DDP3.

The dummy blocking patterns DBP may include first dummy blocking patterns DBP1, second dummy blocking patterns DBP2 disposed at a level lower than that of the first dummy blocking patterns DBP1, and third dummy blocking patterns DBP3 disposed at a level lower than that of the second dummy blocking patterns DBP2. The second dummy blocking patterns DBP2 may be disposed between the first and third dummy blocking patterns DBP1 and DBP3. The cell blocking pattern CBP may be disposed at a level lower than all of the first to third blocking patterns DBP1, DBP2, and DBP3.

The first select conductive pattern SCP1 may be disposed between the first and second dummy storage patterns DDP1 and DDP2. The second select conductive pattern SCP2 may be disposed between the second and third dummy storage patterns DDP2 and DDP3. The third select conductive pattern SCP3 may be disposed between the third dummy storage pattern DDP3 and the cell storage pattern CDP.

The first select conductive pattern SCP1 may be disposed between the first and second dummy blocking patterns DBP1 and DBP2. The second select conductive pattern SCP2 may be disposed between the second and third dummy blocking patterns DBP2 and DBP3. The third select conductive pattern SCP3 may be disposed between the third dummy blocking pattern DBP3 and the cell blocking pattern CBP.

Each of the first to third select conductive patterns SCP1, SCP2, and SCP3 may include an interposition part IN. The interposition parts IN of the first to third select conductive patterns SCP1, SCP2, and SCP3 may overlap with the cell storage pattern CDP and the first to third dummy storage patterns DDP1, DDP2, and DDP3. The interposition parts IN of the first to third select conductive patterns SCP1, SCP2, and SCP3 may overlap with the cell blocking pattern CBP and the first to third dummy blocking patterns DBP1, DBP2, and DBP3.

The interposition part IN of the first select conductive pattern SCP1 may be interposed between the first and second dummy storage patterns DDP1 and DDP2 and between the first and second dummy blocking patterns DBP1 and DBP2. The interposition part IN of the second select conductive pattern SCP2 may be interposed between the second and third dummy storage patterns DDP2 and DDP3 and between the second and third dummy blocking patterns DBP2 and DBP3. The interposition part IN of the third select conductive pattern SCP3 may be interposed between the third dummy storage pattern DDP3 and the cell storage pattern CDP and between the third dummy blocking pattern DBP3 and the cell blocking pattern CBP.

The interposition part IN of the first select conductive pattern SCP1 may be in contact with a first exposed sidewall TL_S1 of the tunnel insulating layer TL, which is exposed between the first and second dummy storage patterns DDP1 and DDP2. The interposition part IN of the second select conductive pattern SCP2 may be in contact with a second exposed sidewall TL_S2 of the tunnel insulating layer TL, which is exposed between the second and third dummy storage patterns DDP2 and DDP3. The interposition part IN of the third select conductive pattern SCP3 may be in contact with a third exposed sidewall TL_S3 of the tunnel insulating layer TL, which is exposed between the third dummy storage pattern DDP3 and the cell storage pattern CDP. The cell conductive pattern CCP may be spaced apart from the tunnel insulating layer TL.

The interposition part IN of the first select conductive pattern SCP1 may be in contact with a bottom surface DDP1_B of the first dummy storage pattern DDP1, a bottom surface DBP_B of the first dummy blocking pattern DBP1, a top surface DDP2_T of the second dummy storage pattern DDP2, and a top surface DBP2_T of the second dummy blocking pattern DBP2. The interposition part IN of the second select conductive pattern SCP2 may be in contact with a bottom surface of the second dummy storage pattern DDP2, a bottom surface of the second dummy blocking pattern DBP2, a top surface of the third dummy storage pattern DDP3, and a top surface of the third dummy blocking pattern DBP3. The interposition part IN of the third select conductive pattern SCP3 may be in contact with a bottom surface of the third dummy storage pattern DDP3, a bottom surface of the third dummy block pattern DBP3, a top surface of the cell storage pattern CDP, and a top surface of the cell blocking pattern CBP.

The isolation structure DS may isolate the first select conductive patterns SCP1 disposed at the same level from each other in the first direction D1. The isolation structure DS may isolate the second select conductive patterns SCP2 disposed at the same level from each other in the first direction D1. The isolation structure DS may isolate the third select conductive patterns SCP3 disposed at the same level from each other in the first direction D1. A lowermost portion DS_B of the isolation structure DS may be disposed between the cell conductive pattern CCP and the third select conductive pattern SCP3.

Recesses RS may be defined by the isolation structure DS. The recesses RS may be formed when a sidewall DS_S of the isolation structure DS is depressed. As such, the recess RS is then defined by the sidewall DS_S of the isolation structure DS whereby the isolation structure DS has been depressed. Each of the first to third select conductive patterns SCP1, SCP2, and SCP3 may include an insertion part SE inserted into the recess RS. A top surface SE_T and a bottom surface SE_B of the insertion part SE of each of the first to third select conductive patterns SCP1, SCP2, and SCP3 may be in contact with the isolation structure DS. The insertion parts SE of the first to third select conductive patterns SCP1, SCP2, and SCP3 may overlap with the isolation structure DS.

Referring to FIG. 1C, a portion of the cell plug PL, which protrudes to the outside of the stack structure STA may be defined as a protrusion part PT. The first part IS1 of the insulating structure IS may cover the protrusion part PT of the cell plug PL. The first part IS1 of the insulating structure IS may cover a top surface PT_T and a sideman PT_S of the protrusion part PT of the cell plug PL.

The first part IS1 of the insulating structure IS may overlap with the cell plug PL. A level of an uppermost portion IS1_UM of the first part IS1 of the insulating structure IS may be higher than that of the top surface PT_T of the protrusion part PT. A width of the first part IS1 of the insulating structure IS in the first direction D1 may be defined as a first width W1. The first width W1 may become largest at a first level LV1. The first level LV1 may be a level between the level of the uppermost portion IS1_UM of the first part IS1 of the insulating structure IS and a level of a central portion of the first part IS1 of the insulating structure IS. The level of the central portion of the first part IS1 of the insulating structure IS may be defined as a second level LV2. A distance between the second level LV2 and the level of the uppermost portion IS1_UM of the first part IS1 of the insulating structure IS may be equal to that between the second level LV2 and a level of a top surface STA_T of the stack structure STA. The second level LV2 may be higher than that of the top surface PT_T of the protrusion part PT.

The first width W1 may become smaller as approaching the top surface STA_T of the stack structure STA from the first level LV1. The first width W1 may become smaller as approaching the uppermost portion IS_UM of the first part IS1 of the insulating structure IS from the first level LV1.

The second part IS2 of the insulating structure IS may cover the top surface STA_T of the stack structure STA. A level of a top surface IS2_T of the second part IS2 of the insulating structure IS may be lower than that of the top surface PT_T of the protrusion part PT.

A width of the first cavity CA1 in the first direction D1, which is defined between the first parts IS1 of the insulating structure IS, may become smaller as approaching the top surface IS2_T of the second part IS2 of the insulating structure IS from the first level LV1.

In the semiconductor device in accordance with an embodiment of the present disclosure, since the first to third select conductive patterns SCP1, SCP2, and SCP3 are in contact with the tunnel insulating layer TL, only the tunnel insulating layer TL is disposed between the first to third select conductive patterns SCP1, SCP2, and SCP3 and the channel layer CL, so that off-characteristics of select transistors can be improved.

In the semiconductor device in accordance with an embodiment of the present disclosure, any storage pattern is not disposed between the first to third select conductive patterns SCP1, SCP2, and SCP3 and the tunnel insulating layer TL. Accordingly, a program operation on a storage pattern connected to the first to third select conductive patterns SCP1, SCP2, and SCP3 in a test process of the semiconductor device can be omitted, and thus the test process of the semiconductor device can be simplified.

FIGS. 2, 3, 4, 5, 6, 7, 8, 9, 10, 11A, 12A, 13, and 14 are sectional views illustrating a manufacturing method of the semiconductor device shown in FIGS. 1A to 1C. FIG. 11B is an enlarged view of region shown in FIG. 11A. FIG. 12B is an enlarged view of region D shown in FIG. 12A.

For convenience of description, components identical to the components described with reference to FIGS. 1A to 1C are designated by like reference numerals, and overlapping descriptions will be omitted.

A manufacturing method described below is merely one embodiment of the manufacturing method of the semiconductor device shown in FIGS. 1A to 1C, and the manufacturing method of the semiconductor device shown in FIGS. 1A to 1C might not be limited to that described below.

Referring to FIG. 2, a stack structure STA may be formed. In an embodiment, the stack structure STA may be formed on a source structure (not shown). The stack structure STA may include stack insulating layers IL, cell sacrificial layers CFL, and select sacrificial layers SFL. The stack insulating layers IL and the cell sacrificial layers CFL may be alternately stacked in the third direction D3. The stack insulating layers IL and the select sacrificial layers SFL may be alternately stacked in the third direction D3. The stack insulating layers IL, the cell sacrificial layers CFL, and the select sacrificial layers SFL may overlap with each other. The select sacrificial layers SFL may be disposed at a level higher than that of the cell sacrificial layers CFL.

The stack insulating layers IL may include an insulating material. In an example, the stack insulating layers IL may include oxide. The cell sacrificial layers CFL may include a material different from that of the stack insulating layers IL. In an example, the cell sacrificial layers CFL may include nitride. The select sacrificial layers SFL may include a material having an etch selectivity with respect to the stack insulating layers IL and the cell sacrificial layers CFL. In an example, the select sacrificial layers SFL may include polysilicon.

A first mask layer MA1 may be formed on the stack structure STA. In an example, the first mask layer MA1 may include nitride. A thickness of the first mask layer MA1 may be greater than that of an uppermost stack insulating layer IL of the stack structure STA.

Referring to FIG. 3, first holes HO1 may be formed, which penetrate the first mask layer MA1 and the stack structure STA. The forming of the first holes HO1 may include forming a photoresist layer (not shown) including a first opening on the first mask layer MA1, and etching the first mask layer MA1 and the stack structure STA, using the photoresist layer as an etch barrier. The first holes HO1 may penetrate the stack insulating layers IL, the cell sacrificial layers CF, and the select sacrificial layers SFL. After the first holes HO1 are formed, remaining photoresist layer may be removed.

Figure 4:
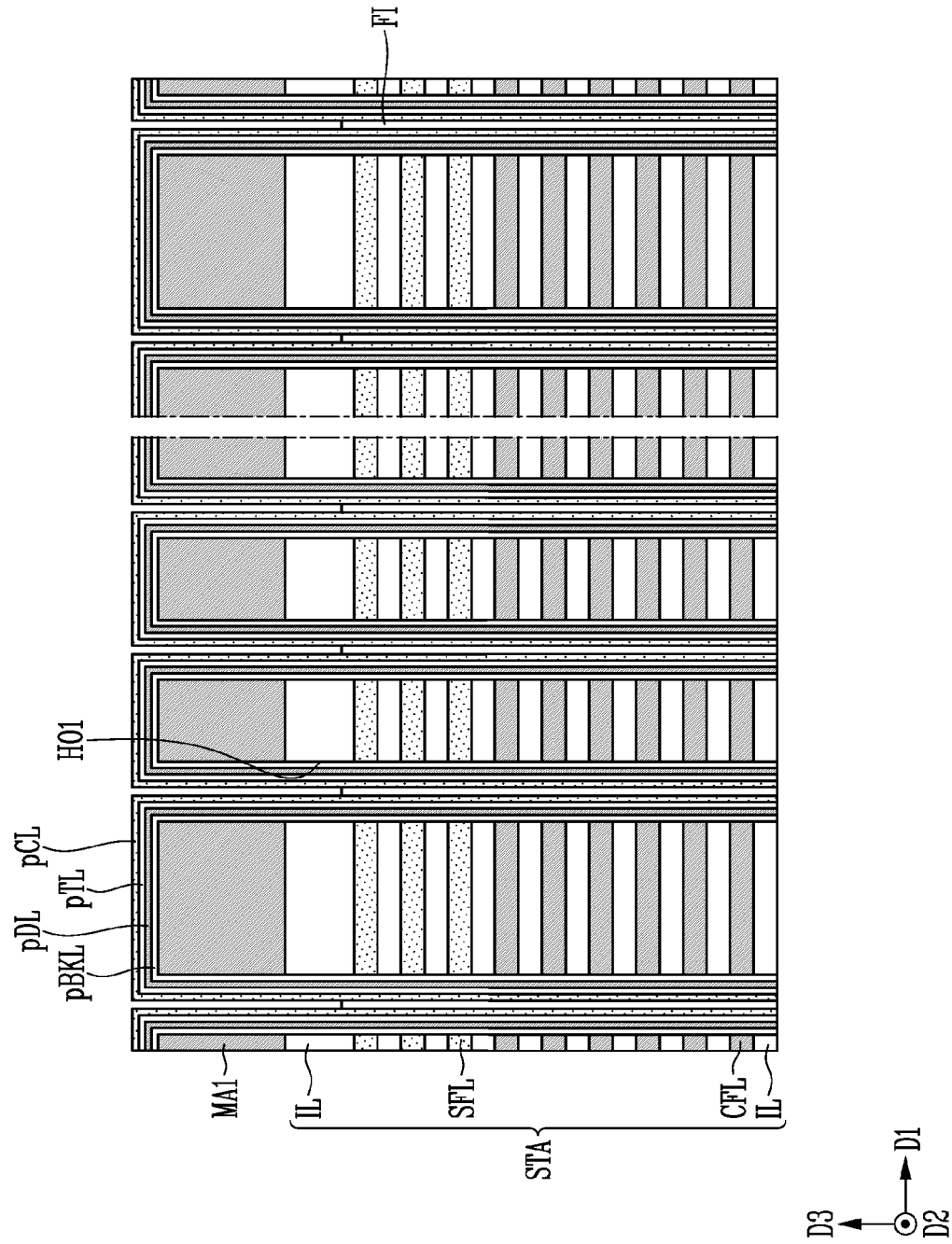

Referring to FIG. 4, a preliminary blocking layer pBKL, a preliminary storage layer pDL, a preliminary tunnel insulating layer pTL, a preliminary channel layer pCL, and a filling layer FI may be sequentially formed. The preliminary blocking layer pBKL may cover sidewalls of the first holes HO1, and cover a top surface of the first mask layer MA1. The preliminary storage layer pDL may cover the preliminary blocking layer pBKL. The preliminary tunnel insulating layer pTL may cover the preliminary storage layer pDL, The preliminary channel layer pCL may cover the preliminary tunnel insulating layer pTL. The filling layer FI may be formed in the preliminary channel layer pCL.

The preliminary blocking layer pBKL may include a material capable of blocking movement of charges. In an embodiment, the preliminary storage layer pDL may include a material in which charges can be trapped. The preliminary tunnel insulating layer pTL may include a material through which charges can tunnel.

The forming of the filling layer FI may include forming a filling material layer covering the preliminary channel layer pCL and removing an upper portion of the filling material layer. A level of a top surface of the filling layer FI may be lower than that of a top surface of the stack structure STA.

Figure 5:
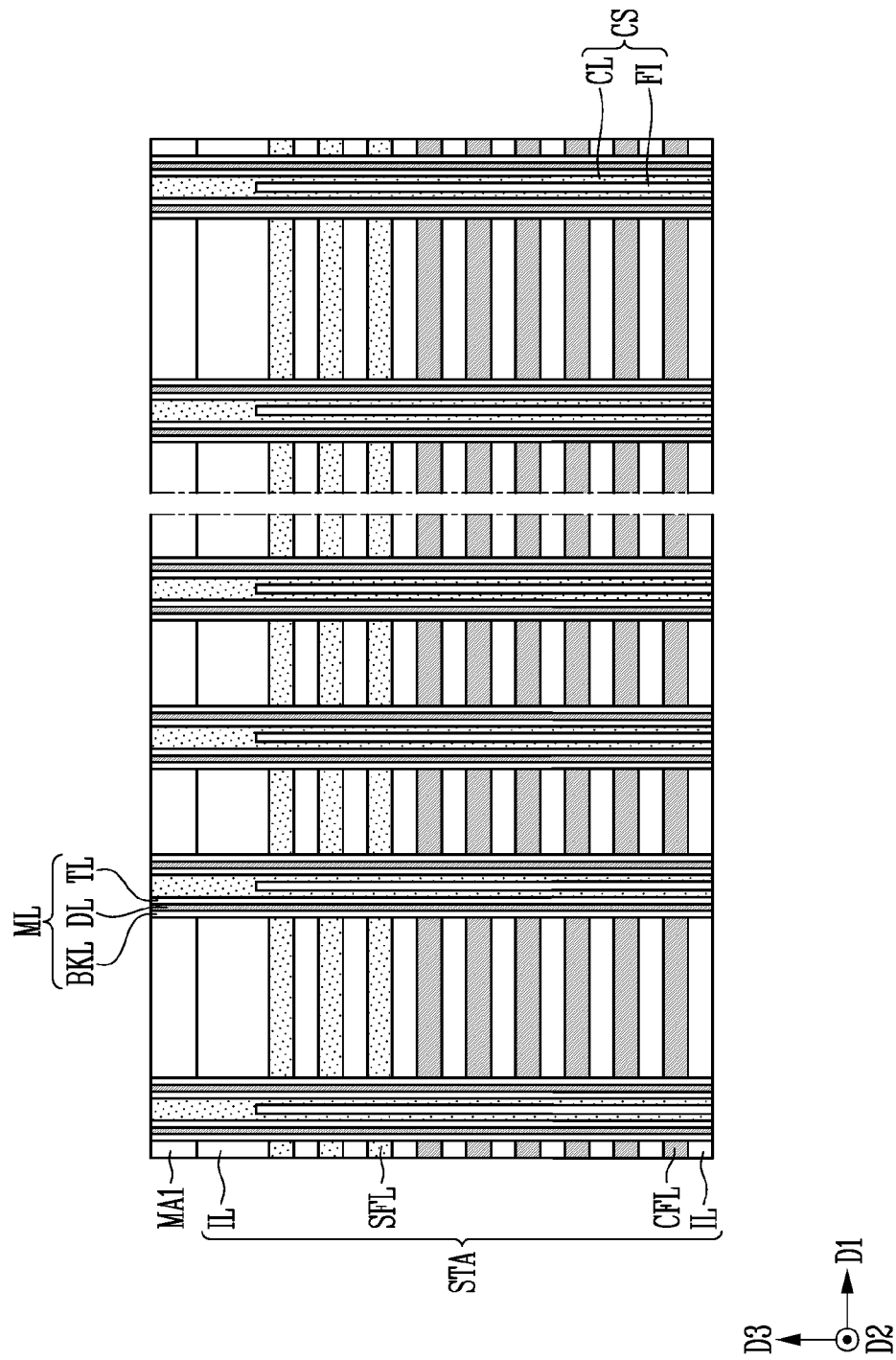

Referring to FIG. 5, a blocking layer BKL, a storage layer DL, a tunnel insulating layer IL, and a channel layer CL may be formed. The forming of the blocking layer BKL, the storage layer DL, the tunnel insulating layer TL, and the channel layer CL may include forming a capping channel layer covering the preliminary channel layer pCL and the filling layer FI, and removing an upper portion of the preliminary blocking layer pBKL, an upper portion of the preliminary storage layer pDL, an upper portion of the preliminary tunnel insulating layer pTL, an upper portion of the preliminary channel layer pCL, and an upper portion of the capping channel layer. The preliminary blocking layer pBKL of which the upper portion is removed may be defined as the blocking layer BKL. The preliminary storage layer pDL of which the portion is removed may be defined as the storage layer DL. The preliminary tunnel insulating layer pTL of which the upper portion is removed may be defined as the tunnel insulating layer TL. The preliminary channel layer pCL of which the upper portion is removed and the capping channel layer of which the upper portion is removed may be defined as the channel layer CL. A memory layer ML may be defined, which includes the blocking layer BKL, the storage layer DL, and the tunnel insulating layer TL.

In an example, the upper portion of the preliminary blocking layer pBKL, the upper portion of the preliminary storage layer pDL, the upper portion of the preliminary tunnel insulating layer pTL, the upper portion of the preliminary channel layer pCL, and the upper portion of the capping channel layer may be removed through chemical mechanical polishing (CMP). An upper portion of the first mask layer MA1 may be removed together with the upper portion of the preliminary blocking layer pBKL, the upper portion of the preliminary storage layer pDL, the upper portion of the preliminary tunnel insulating layer pTL, the upper portion of the preliminary channel layer pCL, and the upper portion of the capping channel layer.

Figure 6:
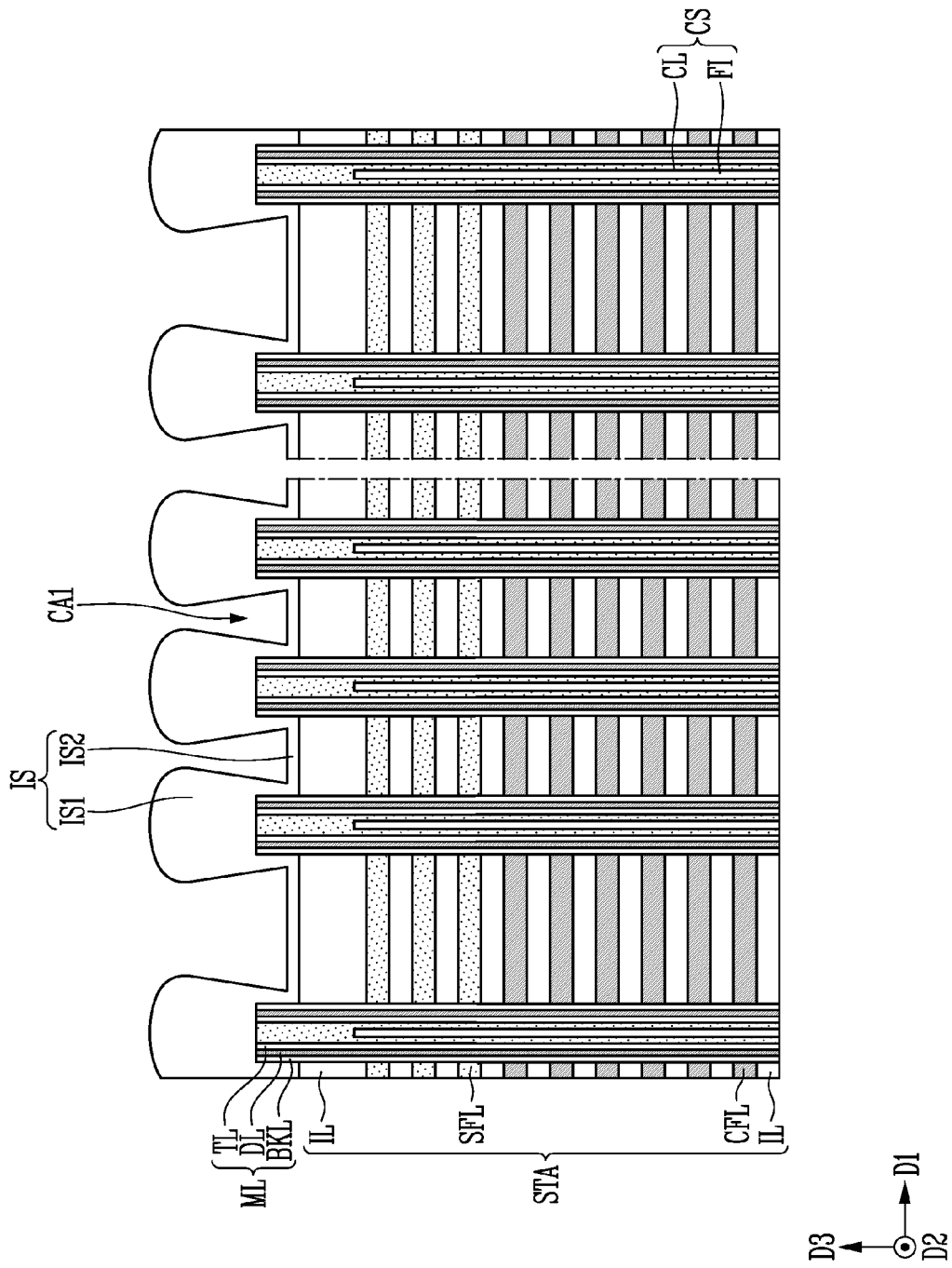

Referring to FIG. 6, the first mask layer MA1 may be removed. In an example, the first mask layer MA1 may be removed through a wet etching process. When the first mask layer MA1 is removed, the top surface of the stack structure STA may be exposed. When the first mask layer MA1 is removed, a top surface of the channel layer CL, a top surface of the tunnel insulating layer TL, a top surface of the storage layer DL, a top surface of the blocking layer BKL, and a portion of an outer wall of the blocking layer BKL may be exposed.

An insulating structure IS may be formed, which covers the top surface of the stack structure STA, the top surface of the channel layer CL, the top surface of the tunnel insulating layer TL, the top surface of the storage layer DL, the top surface of the blocking layer BKL and the portion of the outer wall of the blocking layer BKL. A first part IS1 of the insulating structure IS may cover the top surface of the channel layer CL, the top surface of the tunnel insulating layer TL, the top surface of the storage layer DL, the top surface of the blocking layer BKL and the portion of the outer wall of the blocking layer BKL. A second part IS2 of the insulating structure IS may connect the first parts IS1 of the insulating structure IS to be each other. The second part IS2 of the insulating structure IS may cover the top surface of the stack structure STA.

The insulating structure IS may be formed by depositing a first deposition material. The first deposition material may have a relatively poor step coverage. Since the first deposition material has the relatively poor step coverage, the first part IS1 of the insulating structure IS may be formed thicker than the second part IS2 of the insulating structure IS. Since the first deposition material has the relatively poor step coverage, a width of the first part IS1 of the insulating structure IS may be formed not to be constant. A width of the first part IS1 of the insulating structure IS in the first direction D1 may become largest at a central portion of the first part IS1 of the insulating structure IS and an uppermost portion of the first part IS1 of the insulating structure IS.

A first cavity CA1 may be defined by sidewalls of the first parts IS1 of the insulating structure IS and a top surface of the second part IS2 of the insulating structure IS. The first cavity CA1 may be a space between the first parts IS1 of the insulating structure IS.

Figure 7:
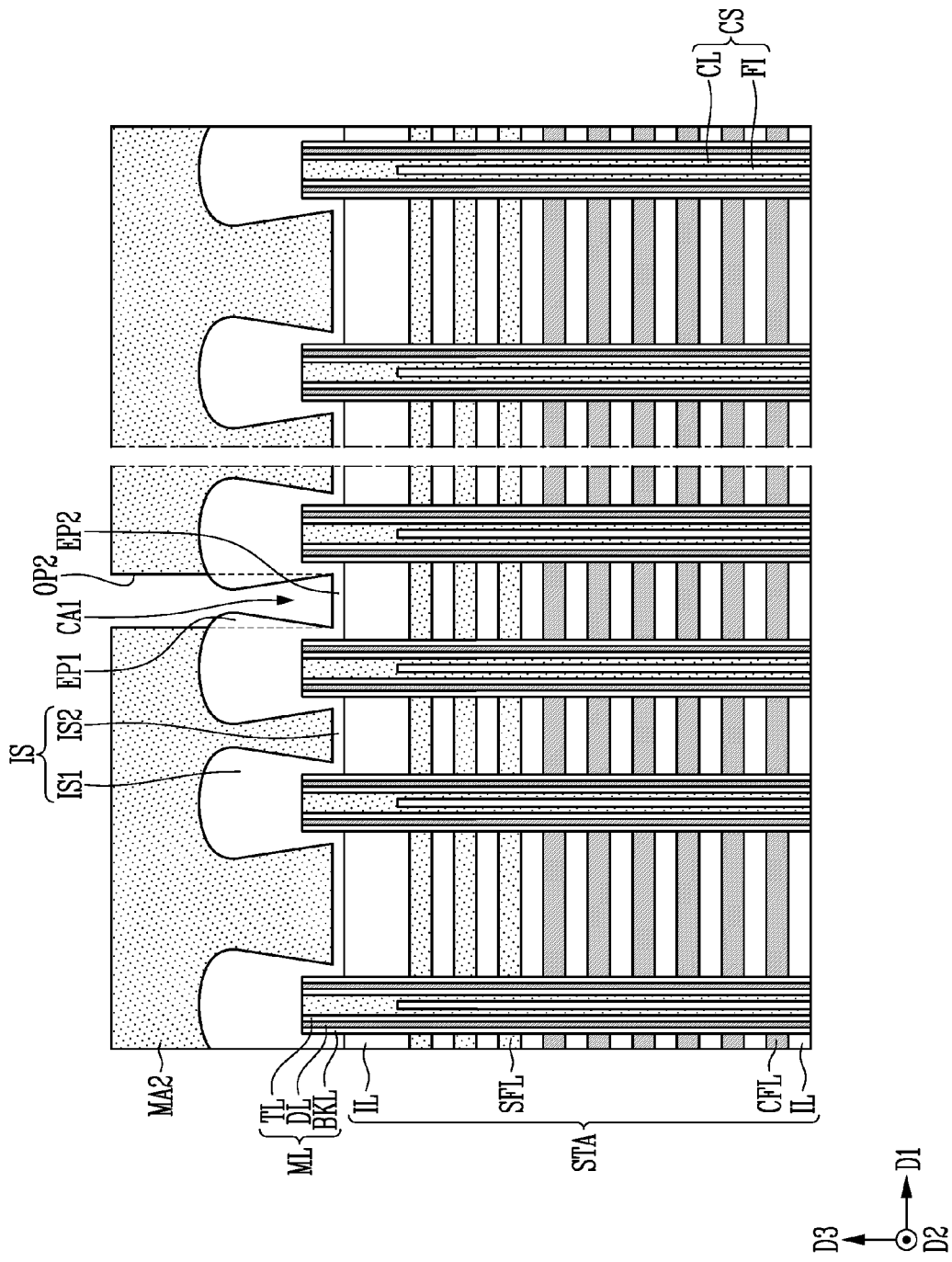

Referring to FIG. 7, a second mask layer MA2 may be formed on the insulating structure IS. The second mask layer MA2 may include a second opening OP2. The second opening OP2 may extend in the second direction D2. The forming of the second mask layer MA2 may include forming the second mask layer MA2 covering the insulating structure IS, and forming the second opening OP2 by removing a portion of the second mask layer MA2. In an example, the second mask layer MA2 may be a photoresist layer.

Some of the first cavities CA1 may be exposed by the second opening OP2 of the second mask layer MA2. A plurality of first cavities CA1 may be exposed by the second opening OP2. The plurality of first cavities CA1 may be connected to the second opening OP2. A portion of the first part IS1 of the insulating structure IS may be exposed by the second opening OP2 of the second mask layer MA2. The portion of the first part IS1 of the insulating structure IS, which is exposed by the second opening OP2 of the second mask layer MA2, may be defined as a first exposed portion EP1. A portion of the second part IS2 of the insulating structure IS may be exposed by the second opening OP2 of the second mask layer MA2. The portion of the second part IS2 of the insulating structure IS, which is exposed by the second opening OP2 of the second mask layer MA2, may be defined as a second exposed portion EP2.

Figure 8:
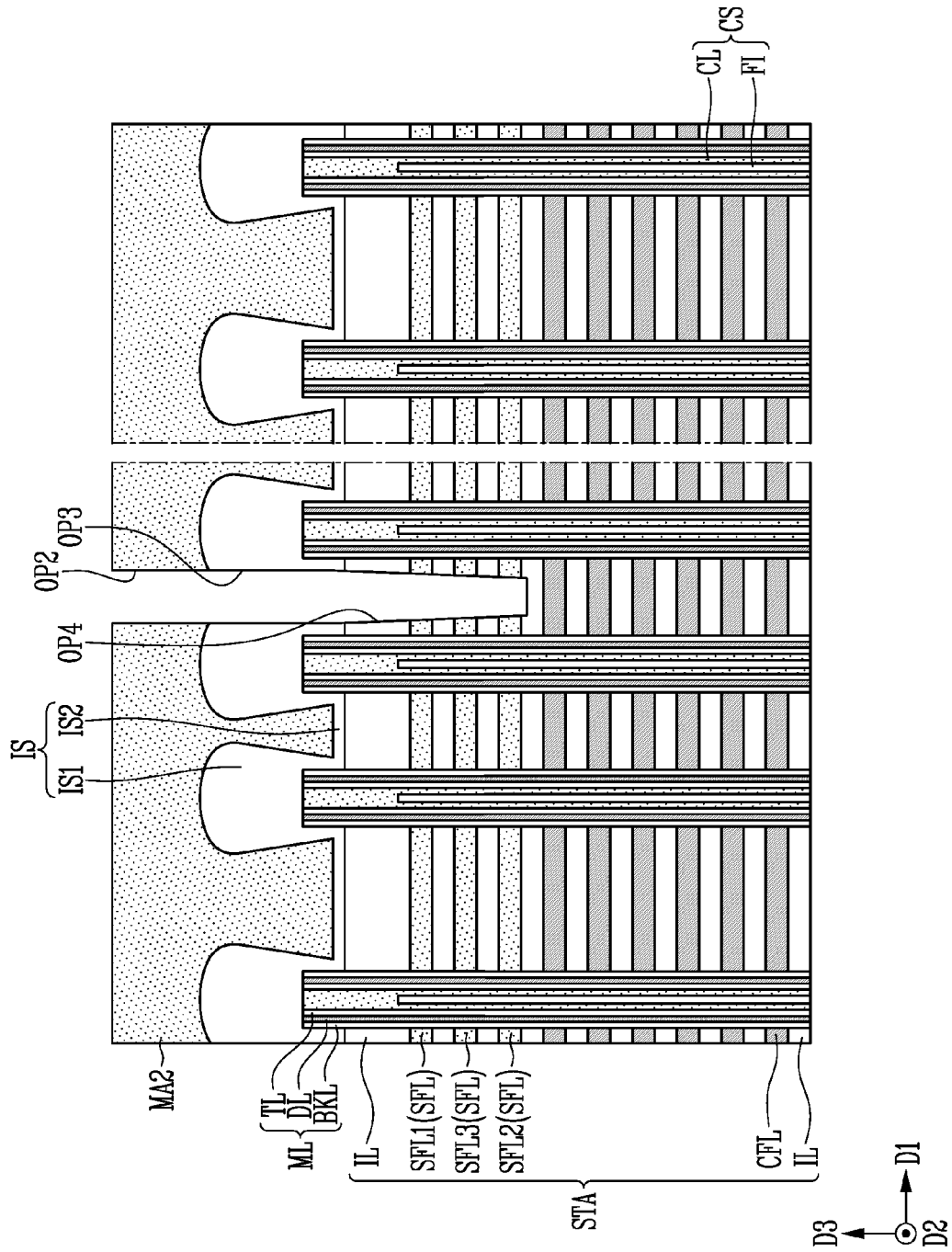

Referring to FIG. 8, the insulating structure IS and the stack structure STA may be etched by using the second mask layer MA2 as an etch barrier. The second exposed portion EP2 exposed through the second opening OP2 of the second mask layer MA2 and the first cavity CA1 may be etched, and the stack structure exposed when the second exposed portion EP2 is etched may be etched. The first exposed portion EP1 may serve as an etch barrier in a process of etching the second exposed portion EP2 and the stack structure STA.

When the insulating structure IS is etched, the first exposed portion EP1 of the first part IS1 of the insulating structure IS may be removed, and the second exposed portion EP2 of the second part IS2 of the insulating structure IS may be removed. A third opening OP3 may be defined by sidewalls of the first parts IS1 of the etched insulating structure IS. A space between the sidewalls of the first parts IS1 of the etched insulating structure IS may be defined as the third opening OP3. The third opening OP3 may extend in the second direction D2.

The stack insulating layers IL and the select sacrificial layers SFL of the stack structure STA may be etched. When the stack insulating layers IL and the select sacrificial layers SFL of the stack structure STA are etched, a fourth opening OP4 may be defined. The fourth opening OP4 may be defined by sidewalls of the etched stack insulating layers IL and the etched select sacrificial layers SFL. A space between the etched stack insulating layers IL and the etched select sacrificial layers SFL may be defined as the fourth opening OP4. The fourth opening OP4 may extend in the second direction D2.

According to the structure of the first part IS1 of the insulating structure IS, the first exposed portion EP1 of the first part IS1 of the insulating structure IS may serve as an etch barrier in a process of forming the fourth opening OP4. Accordingly, the fourth opening OP4 can be formed relatively narrow, even when the second opening OP2 of the second mask layer MA2 is relatively large.

The fourth opening OP4 may be disposed under the third opening OP3. A lowermost portion of the fourth opening OP4 may be disposed in the stack insulating layer IL. The second to fourth openings OP2, OP3, and OP4 may overlap with each other.

The select sacrificial layers SFL may include a first select sacrificial layer SFL1 disposed at the highest level, a second select sacrificial layer SFL2 disposed at the lowest level, and a third select sacrificial layer SFL3 disposed between the first and second select sacrificial layers SFL1 and SFL2.

When the fourth opening OP4 is formed, one first select sacrificial layer SFL1 may be isolated into two first select sacrificial layers SFL1, one second select sacrificial layer SFL2 may be isolated into two second select sacrificial layers SFL2, and one third select sacrificial layer SFL3 may be isolated into two third select sacrificial layers SFL3.

Figure 9:
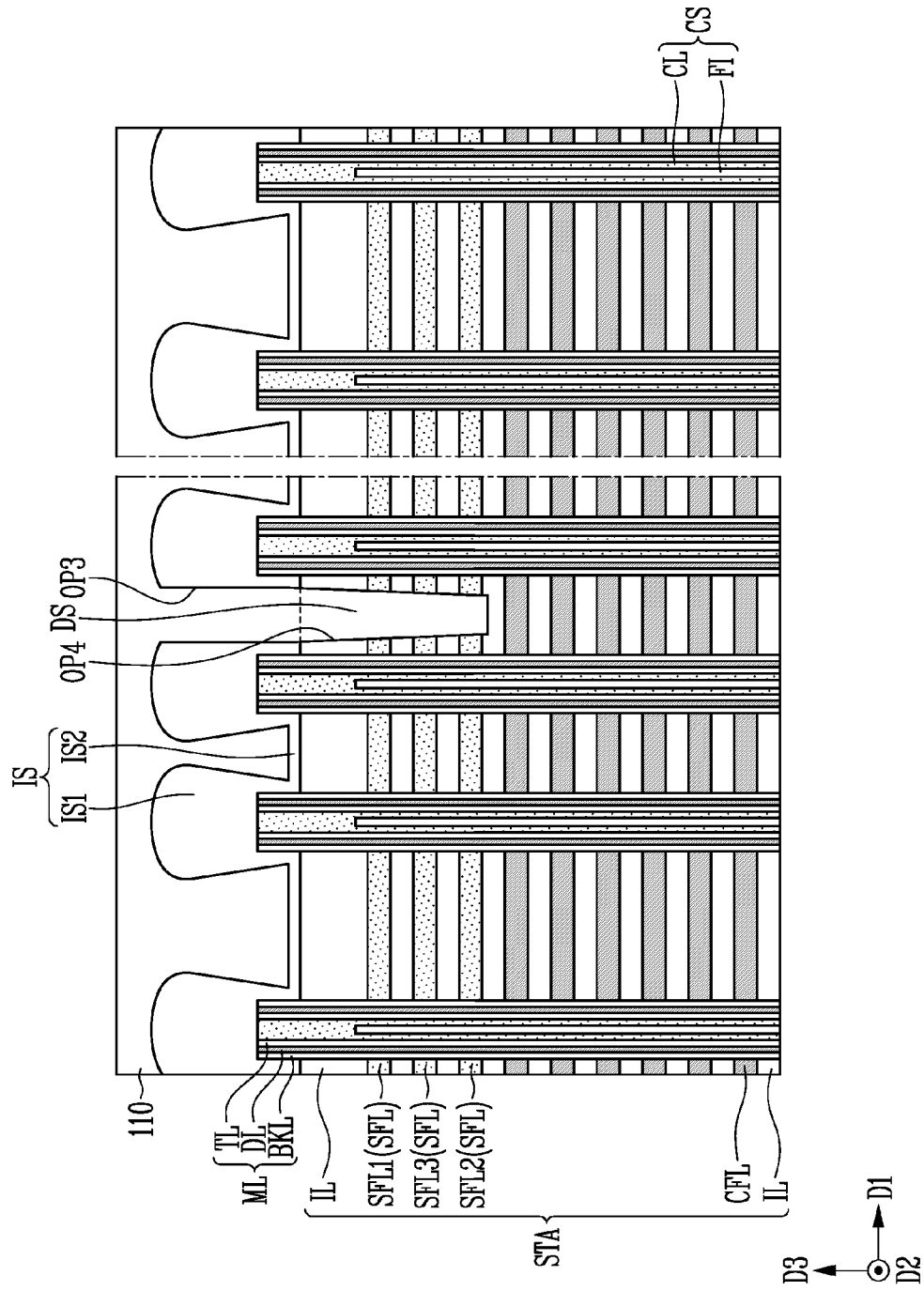

Referring to FIG. 9, the second mask layer MA2 may be removed. Subsequently, an isolation structure DS and a first insulating layer 110 may be formed. The isolation structure DS may fill the fourth opening OP4. The first insulating layer 110 may fill the third opening OP3, and cover the insulating structure IS.

The isolation structure DS and the first insulating layer 110 may be simultaneously formed. The isolation structure DS and the first insulating layer 110 may be formed by depositing a second deposition material through a single process. In an example, the second deposition material may be oxide. The isolation structure DS and the first insulating layer 110 may be continuously formed without any boundary.

Referring to FIG. 10, a third mask layer MA3 may be formed on the first insulating layer 110. The third mask layer MA3 may include fifth openings OP5. The fifth openings OP5 may extend in the second direction D2. The forming of the third mask layer MA3 may include forming the third mask layer MA3 covering the first insulating layer 110, and forming the fifth openings OP5 by removing a portion of the third mask layer MA3. In an example, the third mask layer MA3 may be a photoresist layer.

The first insulating layer 110, the insulating structure IS, and the stack structure STA may be etched by using the third mask layer MA3 as an etch barrier. When the first insulating layer 110, the insulating structure IS, and the stack structure STA is etched, sixth openings OP6 may be formed. The sixth openings OP6 may extend in the second direction D2 and the third direction D3. The fifth and sixth openings OP5 and OP6 may overlap with each other.

In an embodiment, by the sixth opening OP6, one first select sacrificial layer SFL1 may be isolated into two first select sacrificial layers SFL1, and one third select sacrificial layer SFL3 may be isolated into two third select sacrificial layers SFL3. The second select sacrificial layer SFL2 might not be isolated by the sixth opening OP6.

The select sacrificial layers SFL may be exposed by the sixth openings OP6. In an embodiment, sidewalls of the first select sacrificial layers SFL1 isolated by the sixth opening OP6 may be exposed, sidewalls of the third select sacrificial layers SFL3 isolated by the sixth opening OP6 may be exposed, and a top surface of the second select sacrificial layer SFL2 may be exposed.

Figure 11A:
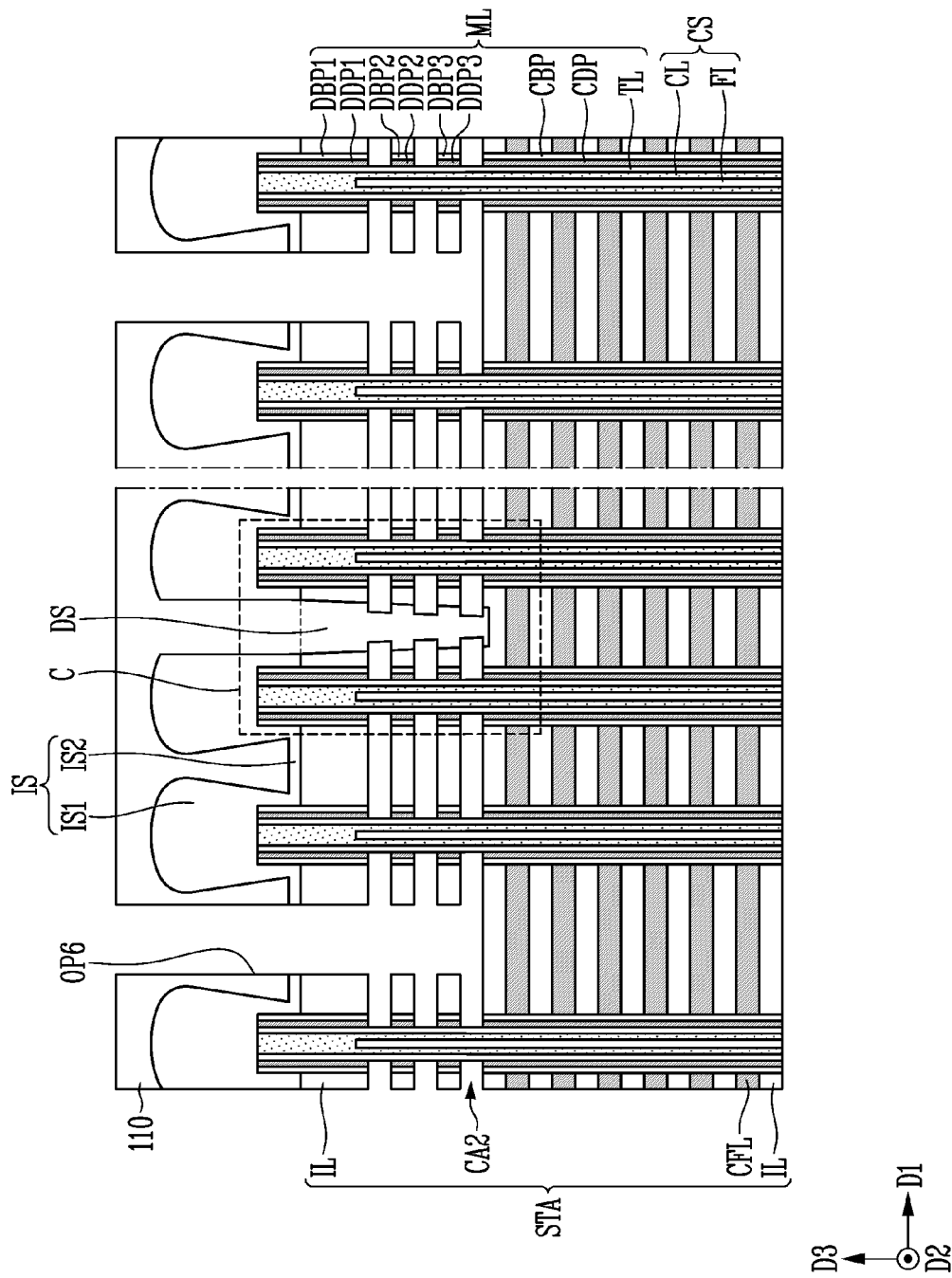
Figure 11B:
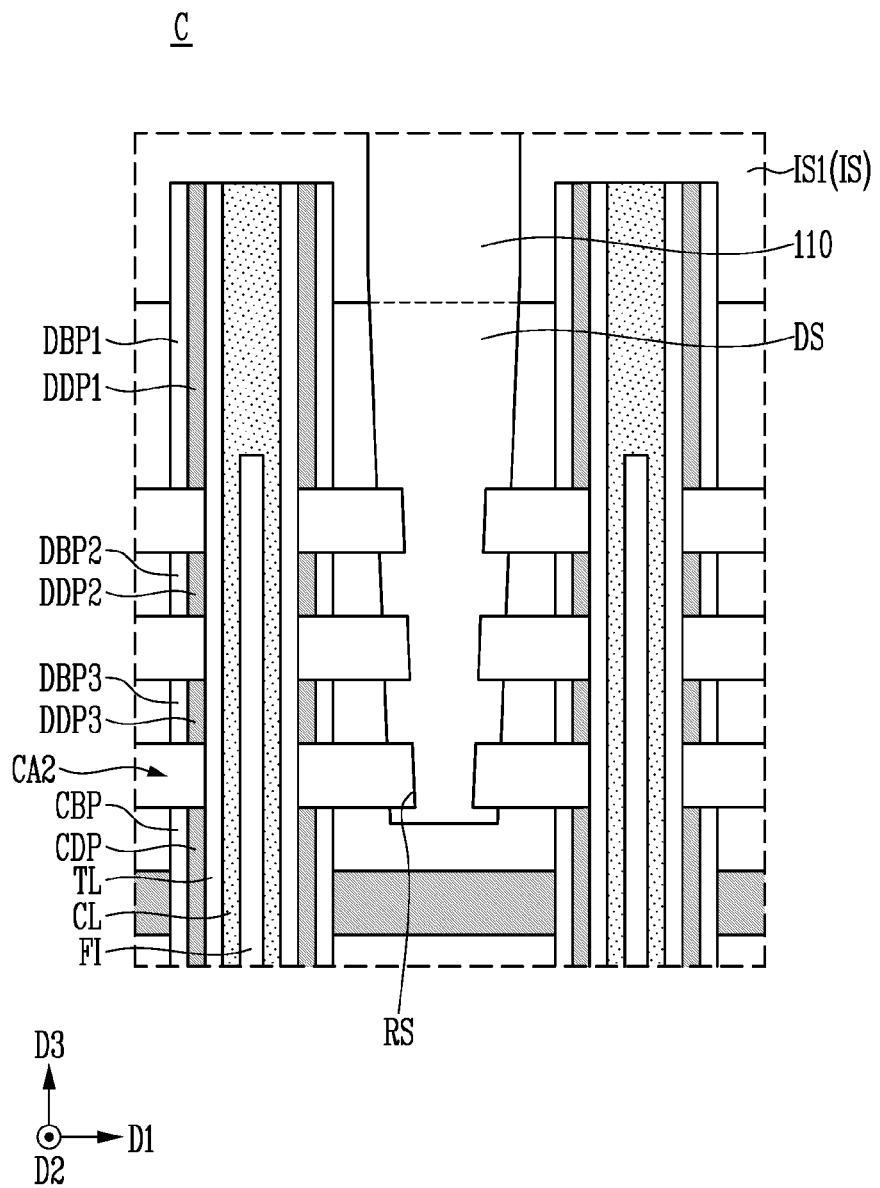
FIG. 11B is an enlarged view of region C shown in FIG. 11A.

Referring to FIGS. 11A and 11B, the third mask layer MA3 may be removed. The select sacrificial layers SFL exposed through the sixth opening OP6 may be removed. The select sacrificial layers SFL may be selectively removed by using a first etching material capable of selectively etching the select sacrificial layers SFL. In an example, the first etching material may be a material capable of selectively etching poly-silicon. When the select sacrificial layers SFL are removed, a sidewall of the blocking layer BKL may be exposed. When the select sacrificial layers SFL are removed, sidewalls of the isolation structure DS may be exposed.

The exposed sidewall of the blocking layer BKL may be etched. The sidewall of the blocking layer BKL may be etched by using a second etching material capable of selectively etching the blocking layer BKL. In an example, the second etching material may be a material capable of selectively etching oxide. When the blocking layer BKL is etched, the blocking layer BKL may be isolated into a cell blocking pattern CBP and first to third dummy blocking patterns DBP1, DBP2, and DBP3. When the blocking layer BKL is etched, a sidewall of the storage layer DL may be exposed.

At the same time when the sidewall of the blocking layer BKL is etched, the sidewall of the isolation structure DS may be etched. The sidewall of the isolation structure DS may be etched by the second etching material. When the isolation structure DS is etched, recesses RS may be defined in a sidewall of the isolation structure DS.

After the blocking layer BKL is etched, the exposed sidewall of the storage layer DL may be etched. The sidewall of the storage layer DL may be etched by using a third etching material capable of selectively etching the storage layer DL. In an example, the third etching material may be a material capable of selectively etching nitride. When the storage layer DL is etched, the storage layer DL may be isolated into a cell storage pattern CDP and first to third dummy storage patterns DDP1, DDP2, and DDP3. When the storage layer DL is etched, a side all of the tunnel insulating layer IL may be exposed.

Empty spaces formed by etching the select sacrificial layers SFL, the blocking layers BKL, and the storage layers DL may be defined as second cavities CA2. The second cavities CA2 may be connected to the sixth opening OP6. The second cavity CA2 may be connected to the recess RS.

Figure 12A:
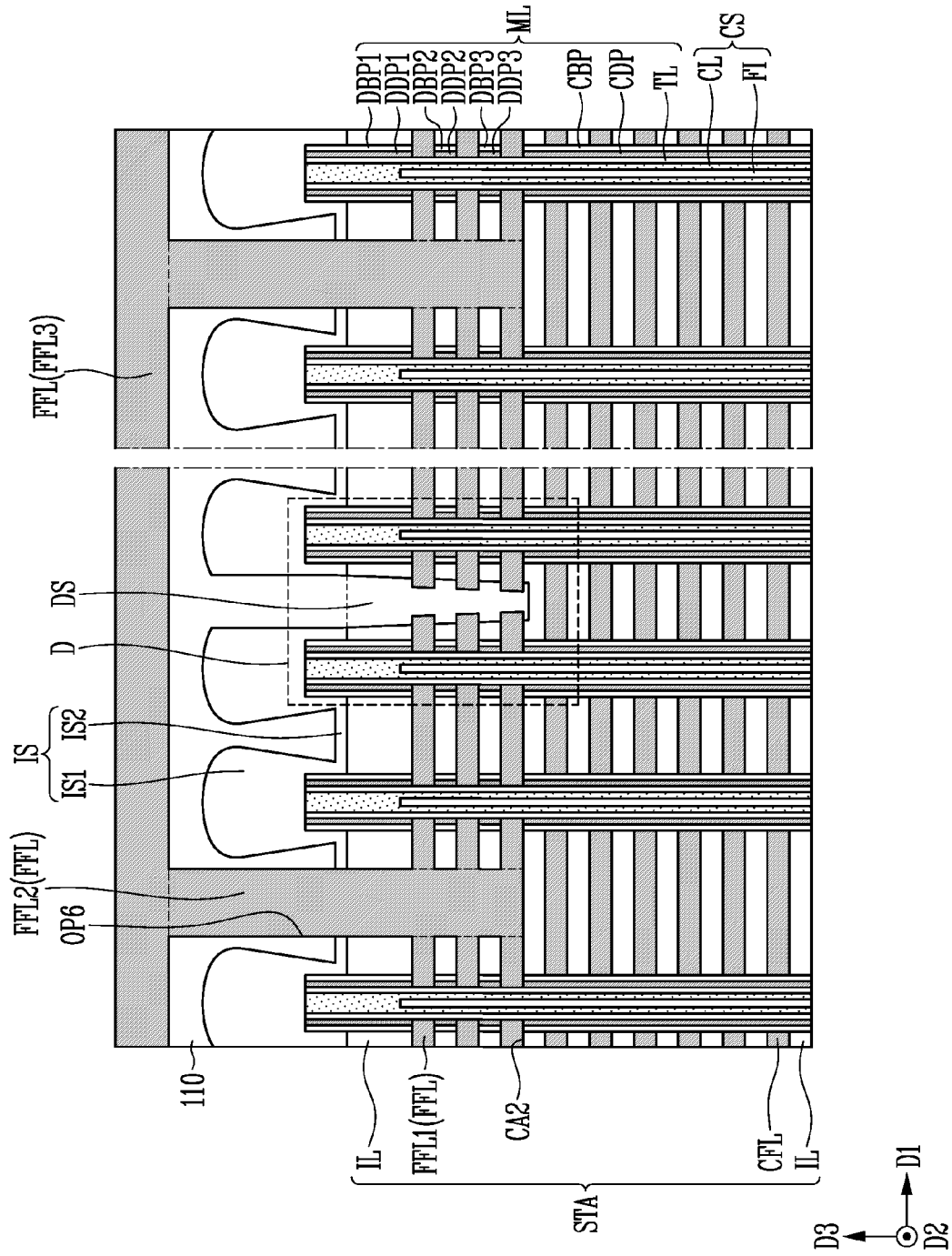
Figure 12B:
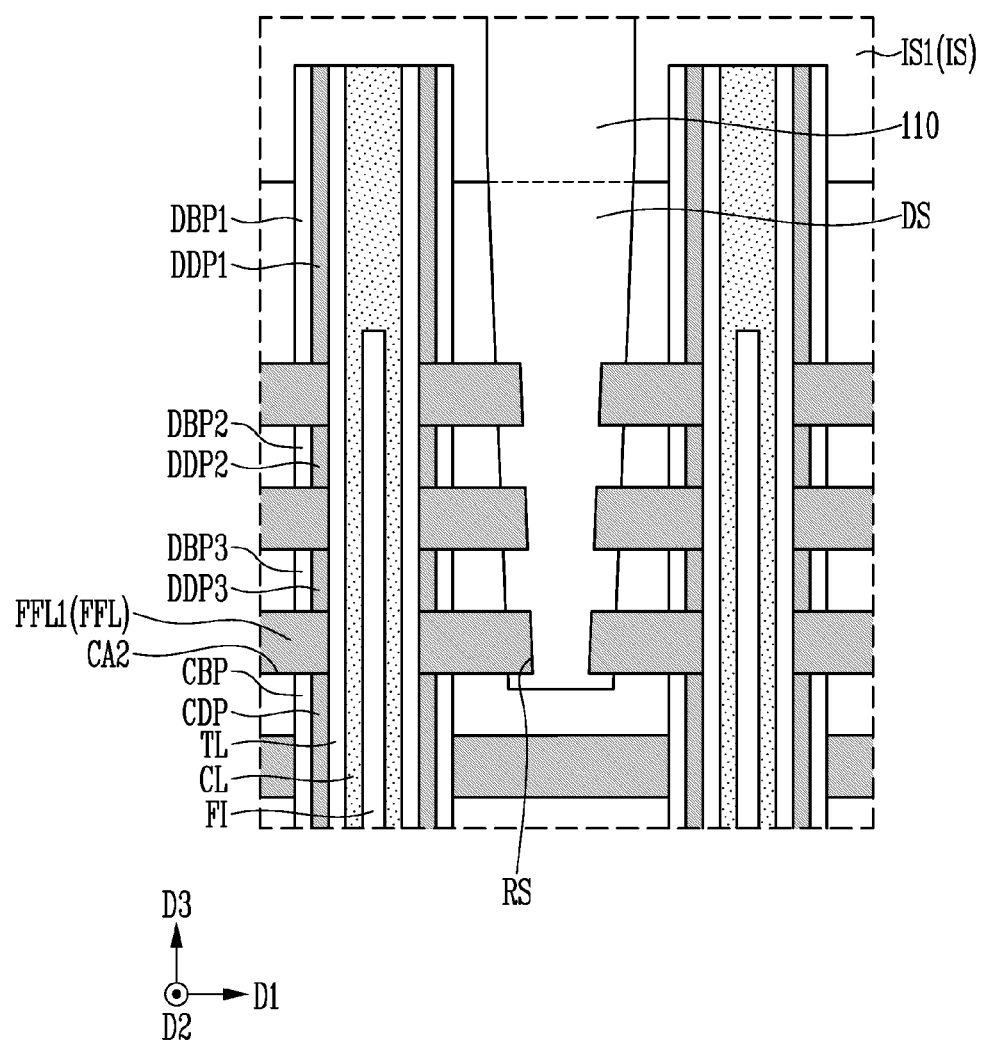
FIG. 12B is an enlarged view of region D shown in FIG. 12A.

Referring to FIGS. 12A and 12B, a filling sacrificial layer FFL may be formed in the recesses RS, the second cavities CA2, and the sixth openings OP6. The filling sacrificial layer FFL may fill the recesses RS, the second cavities CA2, and the sixth openings OP6. The filling sacrificial layer FFL may cover the first insulating layer 110. The filling sacrificial layer FFL may include the same material as the cell sacrificial layers CFL. In an example, the filling sacrificial layer FFL may include nitride.

The filling sacrificial layer FFL may include first parts FFL1, second parts FFL2, and a third part FFL3. The first part FFL1 of the filling sacrificial layer FFL may fill the second cavity CA2. The first part FFL1 of the filling sacrificial layer FFL may fill the recess RS. The second part FFL2 of the filling sacrificial layer FFL may fill the sixth opening OP6. The third part FFL3 of the filling sacrificial layer FFL may cover the first insulating layer 110. The first part FFL1 of the filling sacrificial layer FFL may be connected to the second part FFL2 of the filling sacrificial layer FFL, and the second part FFL2 of the filling sacrificial layer FFL may be connected to the third part FFL3 of the filling sacrificial layer FFL.

The first part FFL1 of the filling sacrificial layer FFL, which is disposed between the cell storage pattern CDP and the third dummy storage pattern DDP3, may be in contact with a top surface of the cell storage pattern CDP, a top surface of the cell blocking pattern CBP, a bottom surface of the third dummy storage pattern DDP3, and a bottom surface of the third dummy blocking pattern DBP3. The first part FFL1 of the filling sacrificial layer FFL, which is disposed between the third dummy storage pattern DDP3 and the second dummy storage pattern DDP2, may be in contact with a top surface of the third dummy storage pattern DD3, a top surface of the third dummy blocking pattern DBP3, a bottom surface of the second dummy storage pattern DDP2, and a bottom surface of the second dummy blocking pattern DBP2. The first part FFL1 of the filling sacrificial layer FFL, which is disposed between the second dummy storage pattern DDP2 and the first dummy storage pattern DDP1 may be in contact with a top surface of the second dummy storage pattern DDP2, a top surface of the second dummy blocking pattern DBP2, a bottom surface of the first dummy storage pattern DDP1, and a bottom surface of the first dummy blocking pattern DBP1. A portion of the first part FFL1 of the filling sacrificial layer FFL may be inserted into the recess RS.

Figure 13:
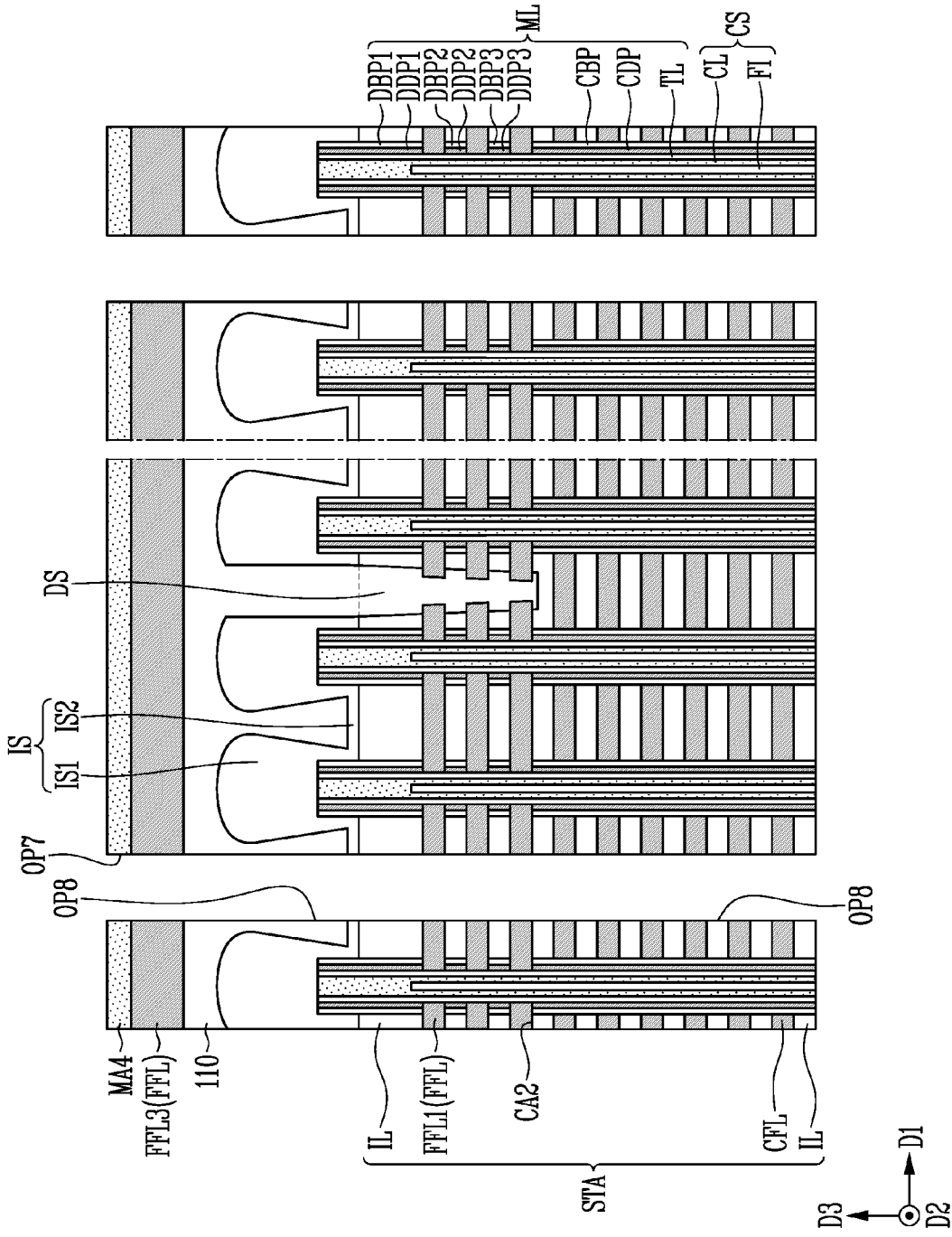

Referring to FIG. 13, a fourth mask layer MA4 may be formed on the filling sacrificial layer FFL. The fourth mask layer MA4 may be formed on the third part FFL3 of the filling sacrificial layer FFL. The fourth mask layer MA4 may include seventh openings OP7. The forming of the fourth mask layer MA4 may include forming the fourth mask layer MA4 covering the filling sacrificial layer FFL, and forming the seventh openings OP7 by removing a portion of the fourth mask layer MA4. In an example, the fourth mask layer MA4 may be a photoresist layer.

The seventh opening OP7 may overlap with the sixth opening OP6. The seventh opening OP7 may overlap with the second part FFL2 of the filling sacrificial layer FFL. The seventh opening OP7 may extend in the second direction D2.

The filling sacrificial layer FFL and the stack structure STA may be etched by using the fourth mask layer MA4 as an etch barrier. A space formed when the filling sacrificial layer FFL and the stack structure STA are etched may be defined as an eighth opening OP8.

When the filling sacrificial layer FFL is etched, the second part FFL2 of the filling sacrificial layer FFL may be removed. When the second part FFL2 of the filling sacrificial layer FFL is removed, the first part FFL1 and the third part FFL3 of the filling sacrificial layer FFL may be isolated from each other. When the second part FFL2 of the filling sacrificial layer FFL is removed, the stack insulating layers IL and the first parts FFL1 of the filling sacrificial layer FFL may be exposed by the eighth opening OP8. The eighth opening OP8 may be defined by the exposed stack insulating layers IL and sidewalls of the exposed first parts FFL1 of the filling sacrificial layer FFL.

The stack insulating layers IL and the cell sacrificial layers CFL of the stack structure STA may be etched. The eighth opening OP8 may be defined by sidewalls of the etched stack insulating layers IL and the etched cell sacrificial layers CFL. The etched stack insulating layers IL and the etched cell sacrificial layers CFL may be exposed by the eighth opening OP8. When the eighth openings OP8 are formed, one cell sacrificial layer CFL may be isolated into a plurality of cell sacrificial layers CFL.

The eighth opening OP8 may extend in the second direction D2 and the third direction D3. The eighth opening OP8 may overlap with the seventh opening OPT The eighth opening OP8 may penetrate the stack structure STA.

Figure 14:
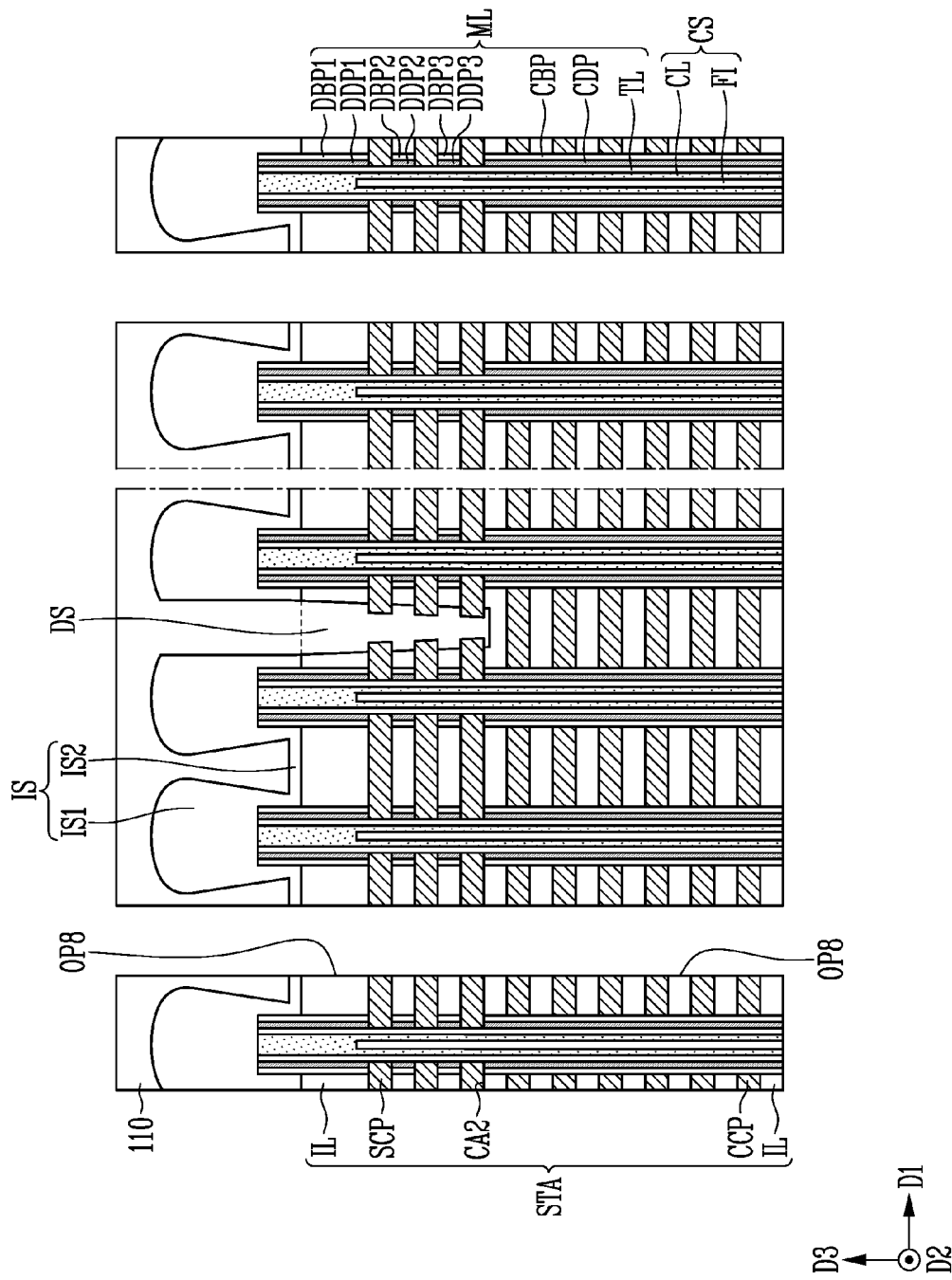

Referring to FIG. 14, the fourth mask layer MA4 may be removed. The first part FFL1 and the third part FFL3 of the filling sacrificial layer FFL and the cell sacrificial layers CFL may be removed. The first part FFL1 and the third part FFL3 of the filling sacrificial layer FFL and the cell sacrificial layers CFL may be selectively etched by using a fourth etching material capable of selectively etching the first part FFL1 and the third part FFL3 of the filling sacrificial layer FFL and the cell sacrificial layers CFL. In an example, the fourth etching material may selectively etch nitride.

When the first parts FFL1 of the filling sacrificial layer FFL are removed, sidewalls of the tunnel insulating layer TL may be exposed.

Select conductive patterns SCP may be formed in empty spaces in which the first parts FFL1 of the filling sacrificial layer FFL are removed. Cell conductive patterns CCP may be formed in empty spaces in which the cell sacrificial layers CFL are removed. The select conductive patterns SCP may be in contact with the exposed sidewalls of the tunnel insulating layer TL.

Subsequently, a slit structure SLS (see FIG. 1A) may be formed in the eighth opening OP8, and bit line contacts connected to the channel layer CL may be formed.

In the manufacturing method of the semiconductor device in accordance with an embodiment of the present disclosure, the channel structure CS and the memory layer ML are formed to protrude upwardly of the stack structure STA, so that the insulating structure IS can be formed to include the first part IS1 and the second part IS2. According to the structure of the first parts IS1 of the insulating structure IS, the first parts IS1 of the insulating structure IS serve as an etch barrier, so that the stack structure STA can be self-aligned etched. Accordingly, the fourth opening OP4 can be formed relatively narrow, even when the second opening OP2 of the second mask layer MA2 is relatively large. Since the fourth opening OP4 is formed relatively narrow, damage of the memory layer ML and the channel structure CS in the process of forming the isolation structure DS can be prevented. Also, since the fourth opening OP4 is formed relatively narrow, a sufficient space in which the select conductive pattern SCP is to be formed between the isolation structure DS and the memory layer ML can be secured. Also, since the fourth opening OP4 is formed relatively narrow, the isolation structure DS can be formed without forming any dummy channel structure and any dummy memory layer.

Figure 15:
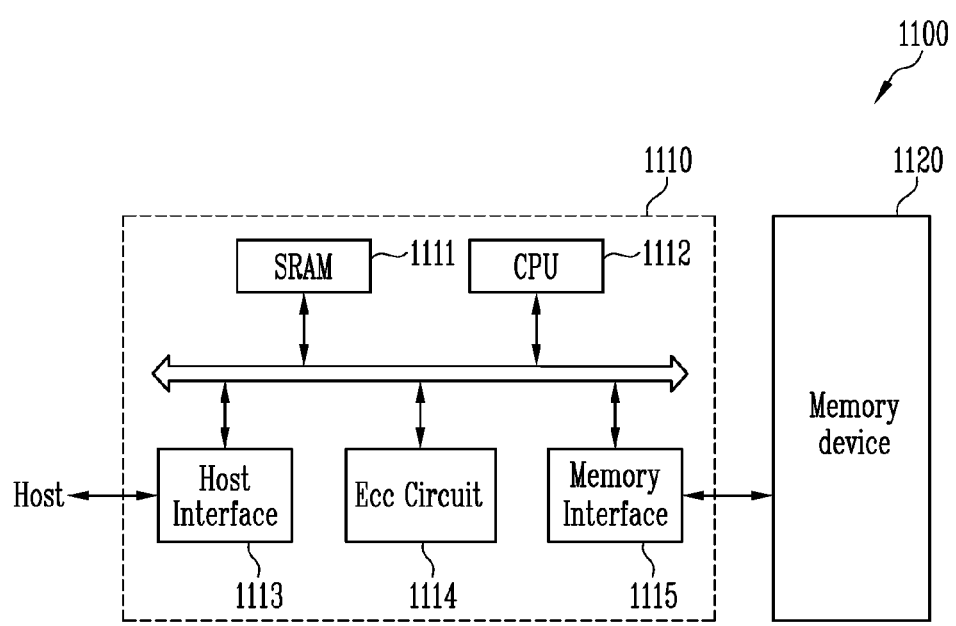
FIG. 15 is a block diagram illustrating a configuration of a memory system in accordance with an embodiment of the present disclosure.

FIG. 15 is a block diagram illustrating a configuration of a memory system in accordance with an embodiment of the present disclosure.

Referring to FIG. 15, the memory system 1100 in accordance with an embodiment of the present disclosure includes a memory device 1120 and a memory controller 1110.

The memory device 1120 may include the semiconductor device described above. The memory device 1120 may be a multi-chip package configured with a plurality of flash memory chips.

The memory controller 1110 is configured to control the memory device 1120, and may include a Static Random Access Memory (SRAM) 1111, a Central Processing Unit (CPU) 1112, a host interface 1113, an Error Correction Code (ECC) circuit 1114, and a memory interface 1115. The SRAM 1111 is used as an operation memory of the CPU 1112, the CPU 1112 performs overall control operations for data exchange of the memory controller 1110, and the host interface 1113 includes a data exchange protocol for a host connected with the memory system 1100. The ECC circuit 1114 detects and corrects an error included in a data read from the memory device 1120, and the memory interface 1115 interfaces with the memory device 1120. In addition, the memory controller 1110 may further include an ROM for storing code data for interfacing with the host, and the like.

The memory system 1100 configured as described above may be a memory card or a Solid State Disk (SSD), in which the memory device 1120 is combined with the controller 1110. For example, when the memory system 1100 is an SSD, the memory controller 1100 may communicated with the outside (e.g., the host) through one of various interface protocols, such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA (SATA) protocol, a Parallel-ATA (DATA) protocol, a Small Computer Small Interface (SCSI) protocol, an Enhanced Small Disk Interface (ESDI) protocol, and an Integrated Drive Electronics (IDE) protocol.

Figure 16:
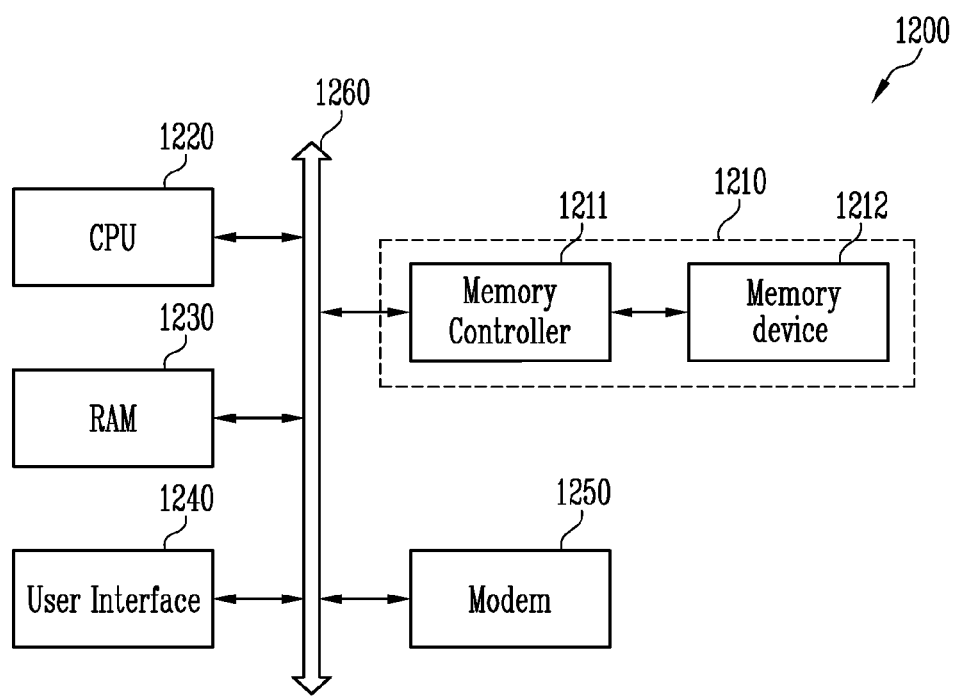
FIG. 16 is a block diagram illustrating a configuration of a computing system in accordance with an embodiment of the present disclosure.

FIG. 16 is a block diagram illustrating a configuration of a computing system in accordance with an embodiment of the present disclosure.

Referring to FIG. 16, the computing system 1200 in accordance with the embodiment of the present disclosure may include a CPU 1220, a random access memory (RAM) 1230, a user interface 1240, a modem 1250, and a memory system 1210, which are electrically connected to a system bus 1260. When the computing system 1200 is a mobile device, a battery for supplying an operation voltage to the computing system 1200 may be further included, and an application chip set, a Camera Image Processor, a mobile DRAM, and the like may be further included.

The memory system 1210 may be configured with a memory device 1212 and a memory controller 1211, which are similar to those described with reference to FIG. 15.

In the semiconductor device in accordance with the present disclosure, the select conductive pattern is in contact with the tunnel insulating layer, so that off-characteristics of select transistors may be improved.

In the manufacturing method of the semiconductor device, the stack structure is etched by using the insulating structure, so that damage of the memory layer and the channel structure in the process of forming the isolation structure may be prevented.

The examples of embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

So far as not being differently defined, all terms used herein including technical or scientific terminologies have meanings that they are commonly understood by those skilled in the art to which the present disclosure pertains. The terms having the definitions as defined in the dictionary should be understood such that they have meanings consistent with the context of the related technique. So far as not being clearly defined in this application, terms should not be understood in an ideally or excessively formal way.

What is claimed is:

1. A method of manufacturing a semiconductor device, the method comprising:
   forming a stack structure including a cell sacrificial layer, a select sacrificial layer, and a stack insulating layer, which overlap with each other;
   forming a first opening exposing the select sacrificial layer;
   removing the select sacrificial layer through the first opening;
   forming a first part of a filling sacrificial layer in an empty space formed by removing the select sacrificial layer;
   forming a second opening exposing the first part of the filling sacrificial layer and the cell sacrificial layer; and
   removing the first part of the filling sacrificial layer and the cell sacrificial layer.

2. The method of claim 1, further comprising forming a second part of the filling sacrificial layer, which fills the first opening.

3. The method of claim 2, wherein the forming of the second opening includes removing the second part of the filling sacrificial layer.

4. The method of claim 1, further comprising forming conductive patterns in empty spaces in which the first part of the filling sacrificial layer and the cell sacrificial layer are removed.

5. The method of claim 1, further comprising forming an isolation structure which isolates the select sacrificial layer.

6. The method of claim 1, further comprising forming a storage layer and a blocking layer, which penetrate the stack structure, wherein the removing of the select sacrificial layer further includes exposing a sidewall of the blocking layer.

7. The method of claim 6, further comprising:
   exposing a sidewall of the storage layer by etching the exposed sidewall of the blocking layer; and
   etching the exposed sidewall of the storage layer.

8. A method of manufacturing a semiconductor device, the method comprising:
   forming a stack structure including a cell sacrificial layer, a select sacrificial layer, and a stack insulating layer, which overlap with each other;
   forming cell plugs penetrating the stack structure, the cell plugs protruding to the outside of the stack structure;
   forming an insulating structure including first parts covering the cell plugs and a second part covering a top surface of the stack structure;
   forming a mask layer including a first opening exposing a cavity between the first parts; and
   etching the stack structure through the first opening and the cavity.

9. The method of claim 8, further comprising etching first exposed portions of the first parts, which are exposed through the first opening.

10. The method of claim 8, wherein the cavity is defined by sidewalls of the first parts and a top surface of the second part.

11. The method of claim 8, wherein the etching of the stack structure includes etching and isolating the select sacrificial layer.

12. The method of claim 8, further comprising forming an isolation structure in the etched stack structure.

* * * * *